(12) United States Patent
Vaidya et al.

(10) Patent No.: US 12,159,813 B2
(45) Date of Patent: Dec. 3, 2024

(54) EMBEDDED BRIDGE DIE WITH THROUGH-SILICON VIAS

(71) Applicant: Intel Corporation, Santa Clara, CA (US)

(72) Inventors: Aditya S. Vaidya, Gilbert, AZ (US); Ravindranath V. Mahajan, Chandler, AZ (US); Digvijay A. Raorane, Chandler, AZ (US); Paul R. Start, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/111,329

(22) Filed: Feb. 17, 2023

(65) Prior Publication Data
US 2023/0197574 A1 Jun. 22, 2023

Related U.S. Application Data

(63) Continuation of application No. 17/323,840, filed on May 18, 2021, now Pat. No. 11,587,851, which is a
(Continued)

(51) Int. Cl.
*H01L 23/48* (2006.01)
*H01L 21/768* (2006.01)
(Continued)

(52) U.S. Cl.
CPC ...... *H01L 23/481* (2013.01); *H01L 21/76898* (2013.01); *H01L 23/49827* (2013.01);
(Continued)

(58) Field of Classification Search
CPC . H01L 24/14; H01L 21/76898; H01L 21/304; H01L 24/11; H01L 21/6836; H01L 24/05; H01L 25/50; H01L 23/36; H01L 24/95; H01L 24/17; H01L 21/78; H01L 24/02; H01L 24/03; H01L 23/544; H01L 21/6835; H01L 25/0657; H01L 24/13; H01L 23/481; H01L 23/482; H01L 23/315; H01L 23/49827; H01L 23/3128; H01L 24/06; H01L 24/09; H01L 24/73; H01L 24/81; H01L 24/83; H01L 25/167; H01L 21/486; H01L 24/80; H01L 24/92;
(Continued)

(56) References Cited

U.S. PATENT DOCUMENTS 9,627,365 B1 4/2017 Yu et al.
11,049,798 B2 6/2021 Vaidya
(Continued)

*Primary Examiner* — Didarul A Mazumder
(74) *Attorney, Agent, or Firm* — Schwabe, Williamson & Wyatt, P.C.

(57) ABSTRACT

An integrated circuit (IC) package comprising a-substrate having a first side and an opposing a second side, and a bridge die within the substrate. The bridge die comprises a plurality of vias extending from a first side to a second side of the bridge die. The bridge die comprises a first plurality of pads on the first side of the bridge die and a second plurality of pads on the second side. The plurality of vias interconnect ones of the first plurality of pads to ones of the second plurality of pads. The bridge die comprises an adhesive film over a layer of silicon oxide on the second side of the bridge die.

18 Claims, 16 Drawing Sheets

Related U.S. Application Data continuation of application No. 16/457,336, filed on Jun. 28, 2019, now Pat. No. 11,049,798, which is a continuation of application No. 15/640,406, filed on Jun. 30, 2017, now Pat. No. 10,373,893.

(51) Int. Cl.

| | | |
|---|---|---|
| *H01L 23/00* | (2006.01) | |
| *H01L 23/49* | (2006.01) | |
| *H01L 23/498* | (2006.01) | |
| *H01L 23/538* | (2006.01) | |
| *H01L 25/065* | (2023.01) | |
| *H01L 25/16* | (2023.01) | |

(52) U.S. Cl.
CPC .......... *H01L 23/5385* (2013.01); *H01L 24/06* (2013.01); *H01L 24/09* (2013.01); *H01L 24/83* (2013.01); *H01L 25/0655* (2013.01); *H01L 25/16* (2013.01); *H01L 24/16* (2013.01); *H01L 2224/16225* (2013.01); *H01L 2224/16237* (2013.01)

(58) Field of Classification Search
CPC ... H01L 23/5384; H01L 21/768; H01L 23/49; H01L 2224/16225; H01L 23/5385
USPC .................. 257/276; 438/214, 280, 411, 619
See application file for complete search history.

(56) References Cited

U.S. PATENT DOCUMENTS

| | | |
|---|---|---|
| 2006/0252245 A1 | 11/2006 | Ke |
| 2008/0280422 A1 | 11/2008 | Shin |
| 2011/0024888 A1 | 2/2011 | Pagaila |
| 2011/0042795 A1 | 2/2011 | Knickerbocker |
| 2012/0175153 A1 | 7/2012 | Kaneko |
| 2012/0273959 A1 | 11/2012 | Park et al. |
| 2013/0032390 A1 | 2/2013 | Hu et al. |
| 2013/0249532 A1 | 9/2013 | Lin |
| 2014/0027880 A1 | 1/2014 | Duevel et al. |
| 2014/0124919 A1 | 5/2014 | Huang |
| 2014/0299999 A1 | 10/2014 | Hu et al. |
| 2014/0353827 A1* | 12/2014 | Liu .................. H01L 25/18 257/774 |
| 2015/0115433 A1 | 4/2015 | Lin |
| 2015/0340303 A1 | 11/2015 | Oh |
| 2016/0141234 A1* | 5/2016 | We .................. H01L 23/5385 361/767 |
| 2016/0141260 A1* | 5/2016 | Chang .................. H01L 24/14 438/613 |
| 2017/0263518 A1 | 9/2017 | Yu et al. |
| 2017/0271266 A1* | 9/2017 | Kim .................. H01L 23/5384 |
| 2018/0006005 A1 | 1/2018 | Cheng et al. |
| 2018/0102311 A1* | 4/2018 | Shih .................. H01L 23/5381 |
| 2018/0138146 A1* | 5/2018 | Cheah .................. H01L 24/33 |

* cited by examiner

EMBEDDED BRIDGE DIE WITH THROUGH-SILICON VIAS

CLAIM FOR PRIORITY

This Application is a continuation of U.S. patent application Ser. No. 17/323,840, filed May 18, 2021, which is a continuation of U.S. patent application Ser. No. 16/457,336, filed Jun. 28, 2019, now U.S. Pat. No. 11,049,798, issued Jun. 29, 2021, which is a Continuation of U.S. patent application Ser. No. 15/640,406, filed Jun. 30, 2017, now U.S. Pat. No. 10,373,893, issued Aug. 6, 2019, and titled "EMBEDDED BRIDGE WITH THROUGH-SILICON VIAS", which are incorporated by reference in their entirety for all purposes.

BACKGROUND

In modern processor package architecture, contact pitches are shrinking to accommodate narrower and more crowded trace routing to direct increasingly faster signals within and between devices. For example, incorporation of high-bandwidth external memory with microprocessors and logic integrated circuits (ICs) in a single package requires a high-density of interconnection capability between the memory and microprocessor ICs. Conventional IC package substrate architectures typically have wide interconnect and routing pitch, and therefore do not support high-density interconnections that utilize sub-100-micron interconnect pitches. Conventional IC package substrate architectures may also require the use of bridging dies to provide an interface between low-density package substrate interconnects to high density IC interconnect architectures.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
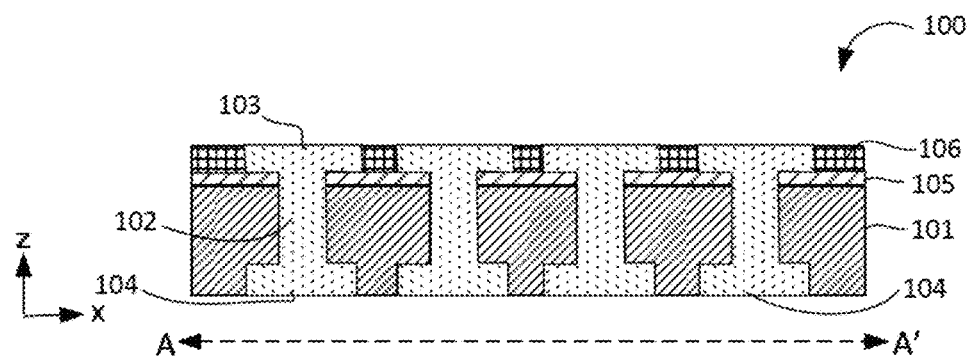
FIG. 1A illustrates a cross-sectional view of a bridge die with vias interconnecting bond pads on both die surfaces, according to some embodiments of the disclosure.

Interconnection between multiple chips in a single package using current package fabrication technology precludes formation of high density signal and power vias and vertical interconnects. Some embodiments combine via-mid through-silicon-via (TSV) processes and create TSVs in a bridge. As such, electrical connectivity is provided through the bridge which otherwise may limit applications of a bridge when multiple voltage rails are connected. In some embodiments, the TSVs in a bridge allows for enabling package embedded fully integrated voltage regulators (FIVRs) with and without multilayer chip inductor (MCI) in the silicon bridge. As such, more local voltage regulation options become available.

There are many technical effects of various embodiments. For example, Alternating Current (AC) noise is reduced by 24%, and peak-to-peak noise is reduced by 7% using TSV through a silicon bridge compared to wrap around power delivery solutions.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

"Bond pad" is a term referring to electrical bond pads in association with test points or external electrical connections of an integrated electronic device such as an IC or MEMS device. Related industry terms are "bond pad" and "bump". "Solder bump" or "bump" is a ball of solder bonded to a bond pad for further assembly of the die into packages by use of surface mount technology, or for wire bonding.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "profile" and "plan" correspond to a orthogonal planes within a cartesian coordinate system. Thus, profile views are taken in the x-z plane, and plan views are taken in the x-y plane. Typically, profile views in the x-z plane are cross-sectional views.

FIG. 1A illustrates a cross-sectional view of a first embodiment of a bridge die 100 with vias interconnecting bond pads on both die surfaces, according to some embodiments.

Bridge die 100 comprises substrate 101 through which metal vias 102 extend. Bond pads 103 and 104 are disposed on both upper and lower surfaces, respectively, of substrate 101. In some embodiments, bond pads 103 are aligned with bond pads 104, and interconnected by vias 102. In some embodiments, bond pads 104 are recessed into substrate 101 and planar with the surface as shown in FIG. 1A, and in other embodiments bond pads 104 are formed directly on the surface of substrate 101. In some embodiments, substrate 101 is a silicon die. In some embodiments, substrate 101 is a silicon-on-insulator die. In some other embodiments, substrate 101 is composed of one of a float glass, borosilicate glass, silicon nitride single crystal die, etc. In some embodiments, substrate 101 is a coreless substrate.

In some embodiments, first dielectric layer 105 is disposed over one surface of substrate 101, through which vias 102 extend. In some embodiments, dielectric 105 is composed of silicon oxides. In some other embodiments, dielectric 105 is composed of one of silicon nitrides (SiN), silicon oxynitride (SiON), carbon-doped oxide (SiOC(H)), MSQ, HSQ, porous dielectrics, etc. In some embodiments, a second dielectric layer 106 is disposed over first dielectric layer 105. In some embodiments, second dielectric layer is a die backside film (DBF). In some other embodiments, second dielectric layer 106 is a B-staged epoxy film. First dielectric layers 105 is intervened between substrate 101 and bond pads 103, which are embedded in second dielectric layer 106, according to some embodiments.

Figure 1B:
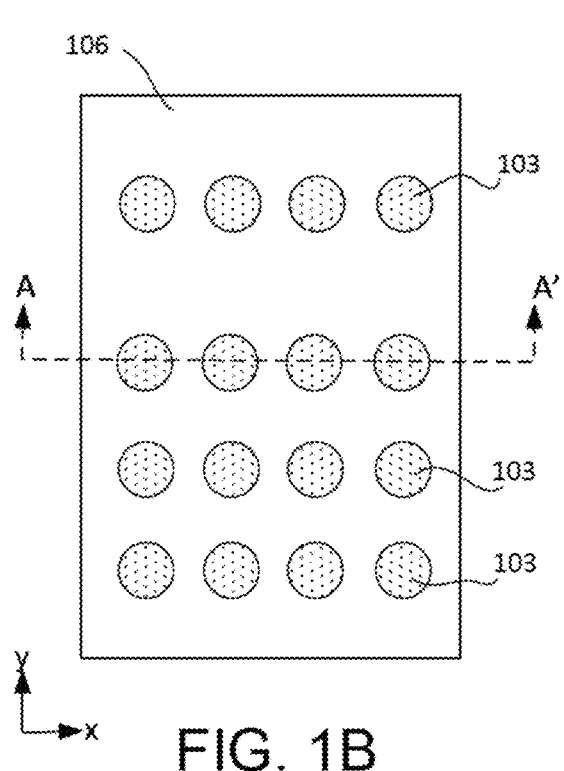
FIG. 1B illustrates a plan view of the bridge die shown in FIG. 1A, showing bond pads disposed on one die surface, according to some embodiments of the disclosure.

FIG. 1B. illustrates a plan view of the bridge die 100 shown in FIG. 1A, showing bond pads disposed on one die surface, according to some embodiments of the disclosure.

In FIG. 1B, an exemplary configuration of bond pads 103 is shown on substrate 101, according to some embodiments. In some embodiments, bond pads 103 are aligned with bond pads 104 on the opposite side of substrate 101 (not shown in FIG. 1B), and vertically coupled with some or all of bond pads 104 by vias 102, not shown in FIG. 1B. Particular sizes and pitches of bond pads 103 vary and are dependent on the pitch requirements of the package, and the contact or solder micro-bump pitches that are built into the IC dies that are connected to bridge die 100 in packaging implementations. In some embodiments, bond pads 103 are embedded in dielectric layer 106 covering the upper surface of substrate 101.

Figure 1C:
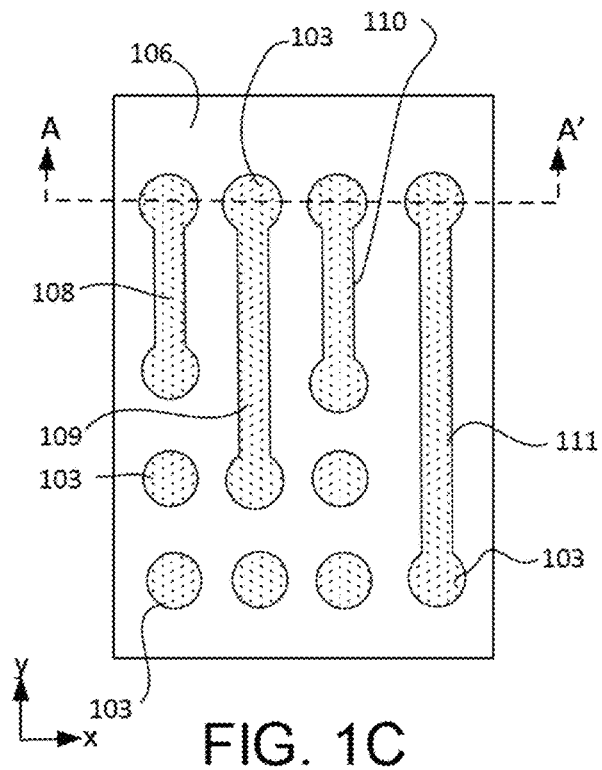
FIG. 1C illustrates a plan view of the bridge die shown in FIG. 1A, showing horizontally interconnected bond pads on one die surface, according to some embodiments of the disclosure.

FIG. 1C illustrates a plan view of the bridge die 100 shown in FIG. 1A, showing horizontally interconnected bond pads on one die surface, according to some embodiments of the disclosure.

In the exemplary configuration of bond pads 103 shown in FIG. 1C, some individual bond pads 103 are coupled to other bond pads 103 on the same side of substrate 101 with horizontal interconnect traces 107, 108, 109 and 110, according to some embodiments. Horizontal coupling of bond pads 103 may be desirable to couple circuits integrated on separate IC dies that are bonded to bridge die 100. Efficient signal routing and power distribution may be accomplished by architectures enabled by employment of bridge die 100. For example, coupling logic dies to Random Access Memory (RAM) dies where high-speed signal paths must be as short as possible through high-density trace routing. Power distribution may also be delivered more efficiently to IC dies coupled to bridge die 100 by routing power from package power buses directly to the IC dies, according to some embodiments.

FIGS. 2A-2I illustrate a sequence of cross-sectional views of the evolution of the bridge die architecture 100 illustrated in FIGS. 1A-1C, as selected operations of an exemplary fabrication method are performed, according to some embodiments of the disclosure.

Figure 2A:
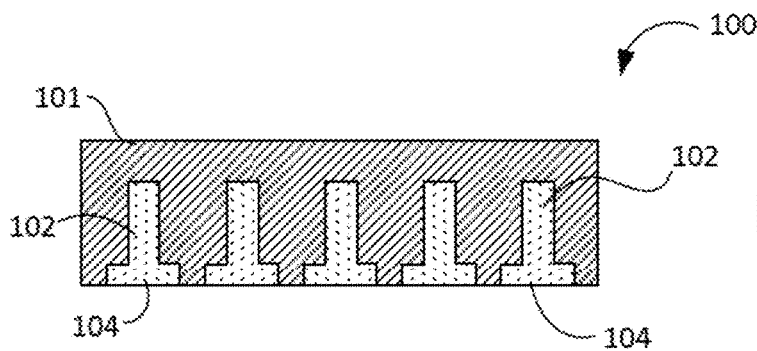
FIGS. 2A-2I illustrate a sequence of cross-sectional views of the evolution of the bridge die architecture illustrated in FIGS. 1A-1C, as selected operations of an exemplary fabrication method are performed, according to some embodiments of the disclosure.
Figure 2B:
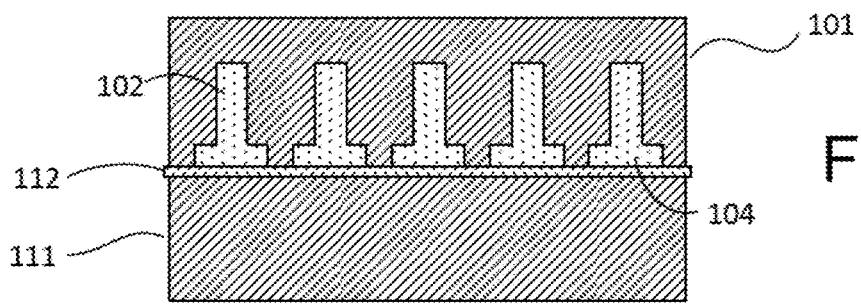

FIG. 2A illustrates un-revealed through-substrate vias 102 formed in substrate 101. Vias 102 are integral with bond pads 104 disposed on one surface of substrate 100, according to some embodiments. In some embodiments, substrate 101 is an entire wafer composed of a suitable material, such as silicon. In some embodiments, substrate 101 is a portion of a wafer, such as a die cut from a wafer. In FIG. 2B, substrate 101 is bonded to carrier substrate 111 by adhesive layer 112, covering bond pads 104, which are planar with the lower surface of substrate 101, according to some embodiments. In some embodiments, carrier substrate 111 is a silicon wafer or die. In some other embodiments, carrier substrate 111 can be any suitable support substrate. In some embodiments, adhesive layer 112 is disposed on a conductive layer, such as a copper foil. In some embodiments, bond pads are electrically coupled to the conductive portions of adhesive layer 112.

Figure 2C:
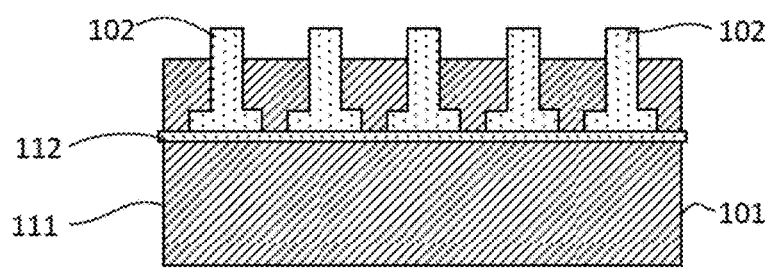

In FIG. 2C, the upper surface of substrate 101 is recessed to partially reveal vias 102. In some embodiments, substrate 101 is recessed by a wet etch (e.g. Potassium Hydroxide (KOH)) or in some other embodiments by reactive ion plasma etching (e.g., Deep Reactive-Ion Etching (DRIE)), which selectively removes the substrate material while vias 102 remain substantially intact. In some embodiments, the depth of the recess is not relevant to the final structure of bridge die 100. In some embodiments, the recess depth is chosen to just reveal the tips of vias 102, along with a small portion of the sidewalls near the tips, as depicted in FIG. 2C.

Figure 2D:
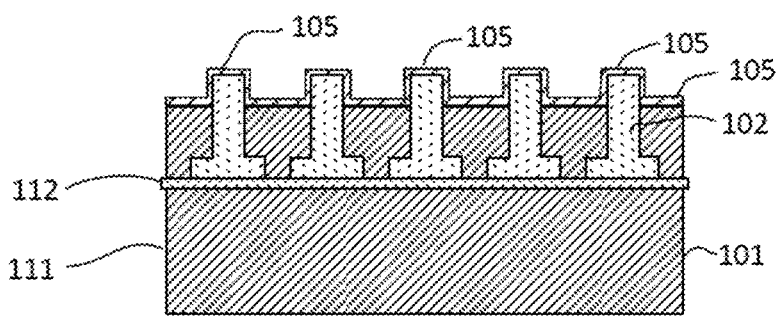

In FIG. 2D, first dielectric layer 105 is grown conformally over the revealed portions of vias 102 as well as the exposed surface of substrate 101. In some embodiments, first dielectric layer 105 is grown by plasma-enhanced chemical vapor deposition (PECVD). In some embodiments, first dielectric layer is grown by RF sputtering. Other deposition techniques for growing first dielectric layer 105 include, but are not limited to, low-pressure chemical vapor deposition (LPCVD) and liquid phase deposition (LPD). In some embodiments, the thickness of first dielectric layer 105 may be chosen so that an adequate insulating layer is provided around revealed vias 102 by first dielectric layer 105, shielding the surrounding substrate (101) surface for electroplating operations in subsequent operations, according to some embodiments.

Figure 2E:
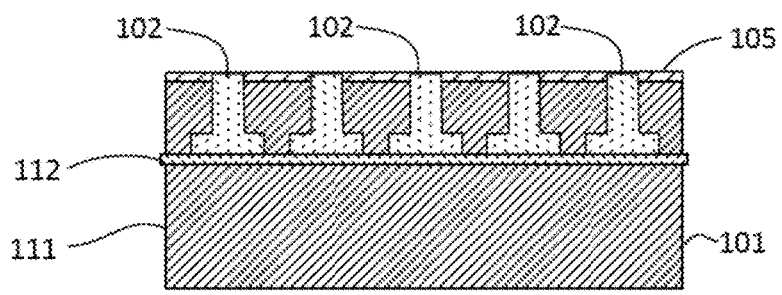

In FIG. 2E, the revealed tips of vias 102 are planarized to be level with first dielectric layer disposed on the recessed surface of substrate 101. In some embodiments, planarization may be accomplished by chemical-mechanical polishing methods. In some embodiments, tips of vias 102 are planar with first dielectric layer 105. In some embodiments, tips of vias 102 are free of dielectric material.

Figure 2F:
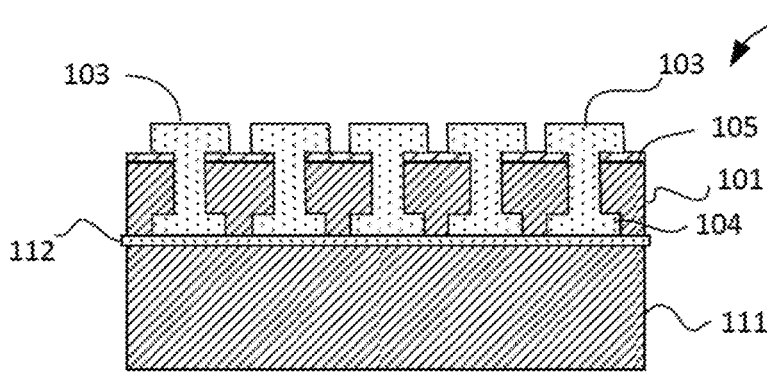

In FIG. 2F, bond pads 103 are formed integrally with tips of vias 102, and grow over first dielectric layer 105, such that bond pads 103 have a larger diameter than vias 102. Bond pads 103 are separated from substrate 101 by first dielectric layer 105. In some embodiments, bond pads 103 are formed by electroplating copper onto tips of vias 102, which are exposed to an electroplating bath. Vias 102 are coupled to a voltage source or potentiostat through conductive portions of adhesive layer 112 coupled to bond pads 104 on the opposite side of substrate 101, according to some embodiments. In some embodiments, bond pads 103 are formed by electro-less deposition methods. In some other embodiments, bond pads 103 are formed by vacuum deposition methods, such as sputtering or evaporation. In some embodiments, bond pads are composed of any suitable metal, and the thickness of bond pads 103 is determined by robustness of the deposited material, according to some embodiments.

Figure 2G:
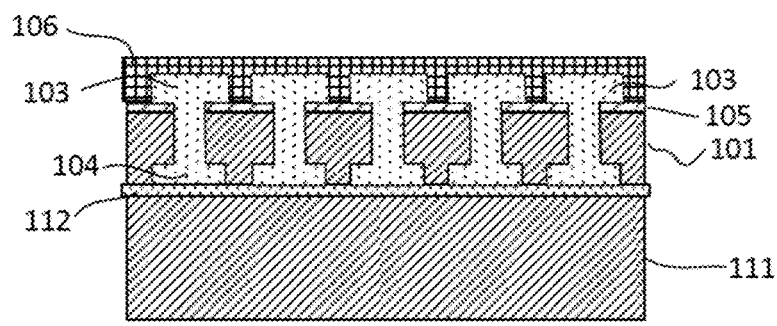

In FIG. 2G, second dielectric layer 106 is deposited over first dielectric layer 105 as well as bond pads 103. In some embodiments, second dielectric layer 106 is a laminated film, such as die backside film (DBF). In some embodiments, second dielectric layer 106 is a dry resist laminate. In some other embodiments, second dielectric layer 106 is a B-staged epoxy film that is applied by spin-coating or spray coating, then partially cured, according to some embodiments. The thickness of second dielectric layer 106 may be several 10s of microns, for example. In some embodiments, second dielectric layer 106 embeds bond pads 103.

Figure 2H:
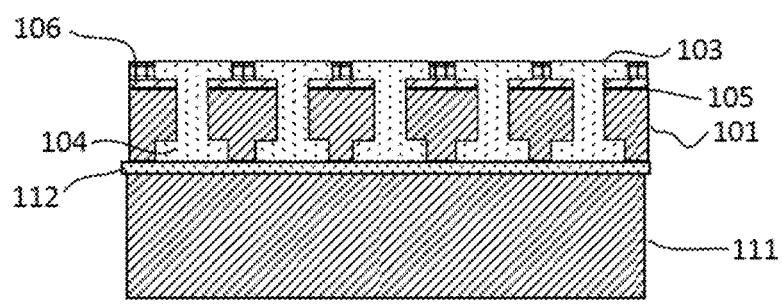

In FIG. 2H, second dielectric layer 106 is planarized to reveal the tops of bond pads 103. The sidewalls of bond pads 103 are embedded in the remaining material of second dielectric layer 106, according to some embodiments. In some embodiments, exposed portions of bond pads 103 are substantially free of dielectric material.

Figure 2I:
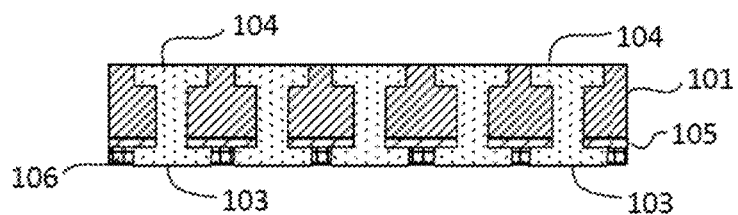

In FIG. 2I, solder bumps 113 have been bonded to bond pads 103, according to some embodiments.

Figure 3:
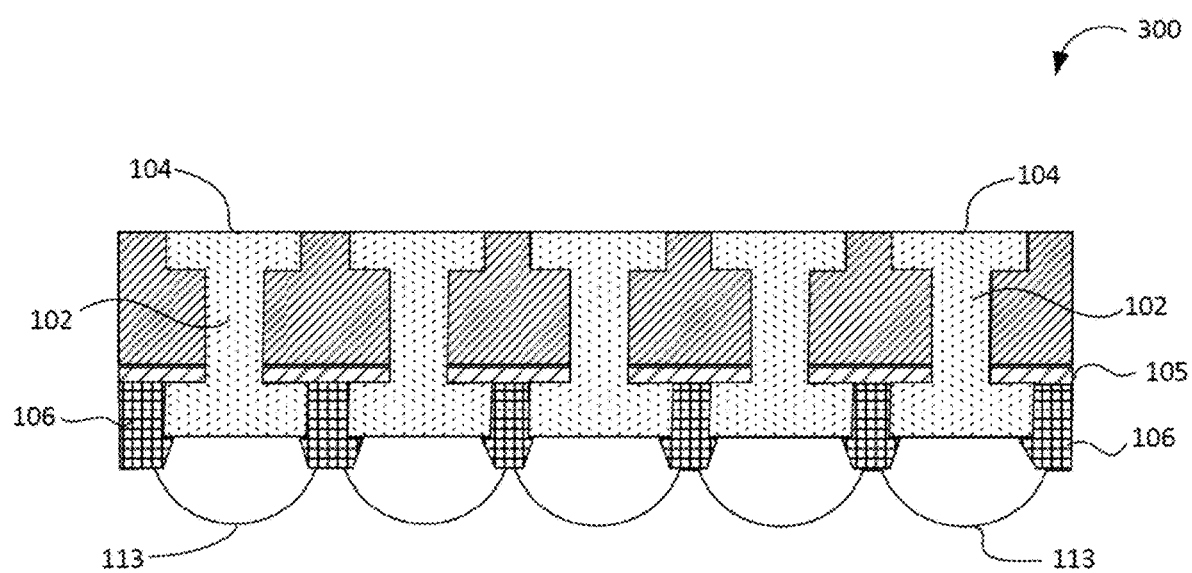
FIG. 3 illustrates a cross-sectional view of a bridge die, according to some embodiments of the disclosure.

FIG. 3 illustrates a cross-sectional view of a second embodiment of bridge die 300, according to some embodiments of the disclosure.

In FIG. 3, a second embodiment 300 of the bridge die architecture is shown.

Notably, bond pads 103 are recessed below second dielectric 106, according to some embodiments. Solder bumps 113 are partially embedded in dielectric 106, in accordance with some embodiments. In some embodiments, contacts 103 extend horizontally beyond tops of vias 102, forming on first dielectric layer 105 surrounding vias 102. In some embodiments, bond pads 103 are embedded in second dielectric 106.

FIGS. 4A-4D illustrate a sequence of cross-sectional views of the evolution of the bridge die architecture 300 illustrated in FIG. 3, as selected operations of an exemplary fabrication method are performed, according to some embodiments of the disclosure.

Figure 4A:
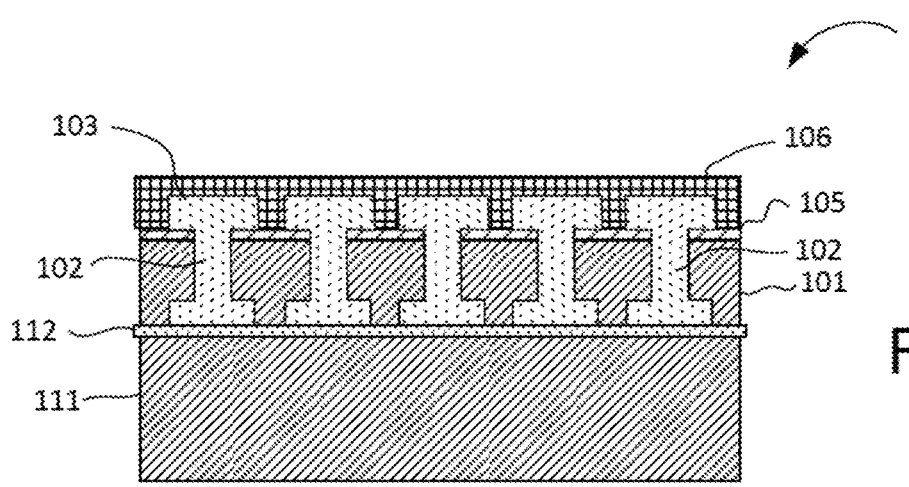
FIGS. 4A-4D illustrate a sequence of cross-sectional views of the evolution of the bridge die architecture illustrated in FIG. 3, as selected operations of an exemplary fabrication method are performed, according to some embodiments of the disclosure.

In FIG. 4A, a partially complete bridge die 300 is shown bonded to carrier substrate 111. In some embodiments, the level of completion of bridge die 300 in FIG. 4A is the same as shown in FIG. 2G for bridge die 100, and description related to it and build-up in previous operations is found in the corresponding paragraphs above. In some embodiments, bond pads 103 are covered by second dielectric 106.

Figure 4B:
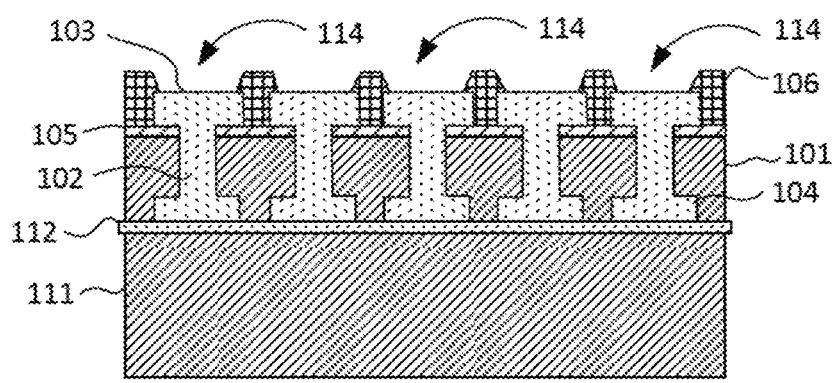

In FIG. 4B, openings 114 are made in second dielectric layer 106 that are aligned with bond pads 103. In some embodiments, bond pads 103 tops are exposed and substantially free of dielectric material. In some embodiments, bond pads 103 are recessed below second dielectric 106. In some embodiments, openings 114 are formed by laser skiving methods. In some embodiments, openings 114 are formed by plasma etching (e.g., DRIE). In some embodiments, second dielectric 106 is a dry photoresist, and openings 114 are formed by photolithographic methods.

Figure 4C:
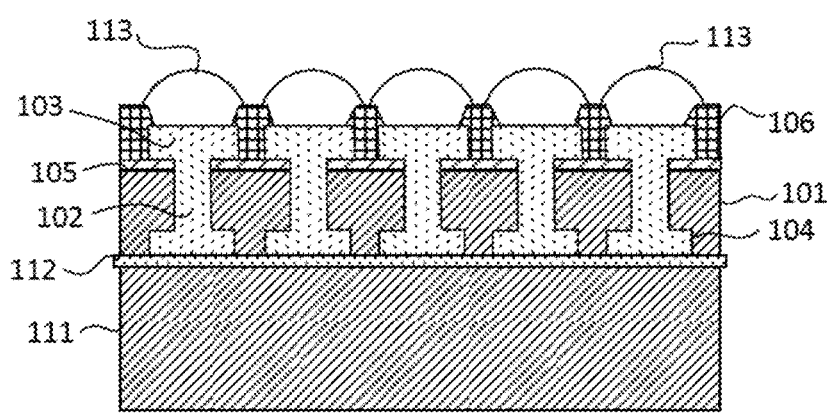

In FIG. 4C, solder bumps 113 are plated into openings 114 and bonded to bond pads 103 through openings 114, according to some embodiments. In some embodiments, an epoxy flux film is applied over bumps 113. Epoxy flux films may be applied by suitable techniques (e.g., vacuum lamination at elevated temperatures to soften the epoxy film), according to some embodiments. Epoxy flux films may be implemented to enable formation of solder joints during bonding of solder bumps 113 to bond pads in the package substrate and protect the joints post-bonding.

Epoxy flux films may be planarized at lower temperatures to increase the modulus, by various methods (e.g. fly cutting), according to some embodiments. During bonding, elevated temperatures enable epoxy flux films to soften and flow over package substrate bond pads at solder reflow temperatures, facilitating high quality solder joint formation. In some embodiments, the post-bond re-solidified and cured epoxy adheres to the dielectric portions of the package substrate, increasing the bond strength of the bridge die to the package substrate beyond the strength of the solder joint bonds.

Alternatively, epoxy flux pastes (not shown) may be employed for facilitating solder joint formation, according to some embodiments. Epoxy pastes may not need lamination and planarization, and may be applied by dipping, spray coating, and spin coating, according to some embodiments. The flux pastes may be solidified by thermal curing during or after bonding, according to some embodiments.

Figure 4D:
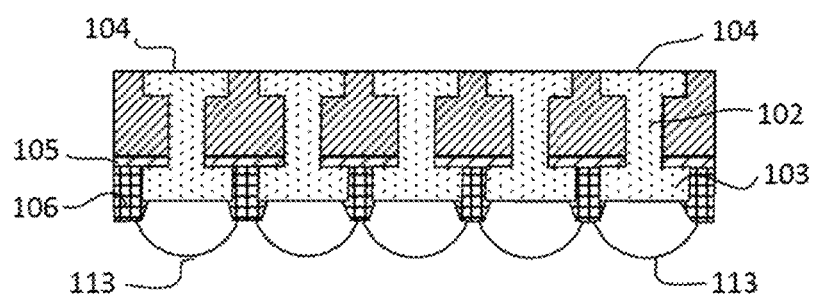

In FIG. 4D, carrier wafer 111 and adhesion layer 112 are removed from finished bridge die 300, shown inverted from previous views. In some embodiments, implementations of bridge die 300 utilize dielectric layer 106 to help tack adhere bridge die 100 to a package substrate during build-up of the package before and during bonding of solder bumps 113 to package conductors at elevated temperatures.

Figure 5:
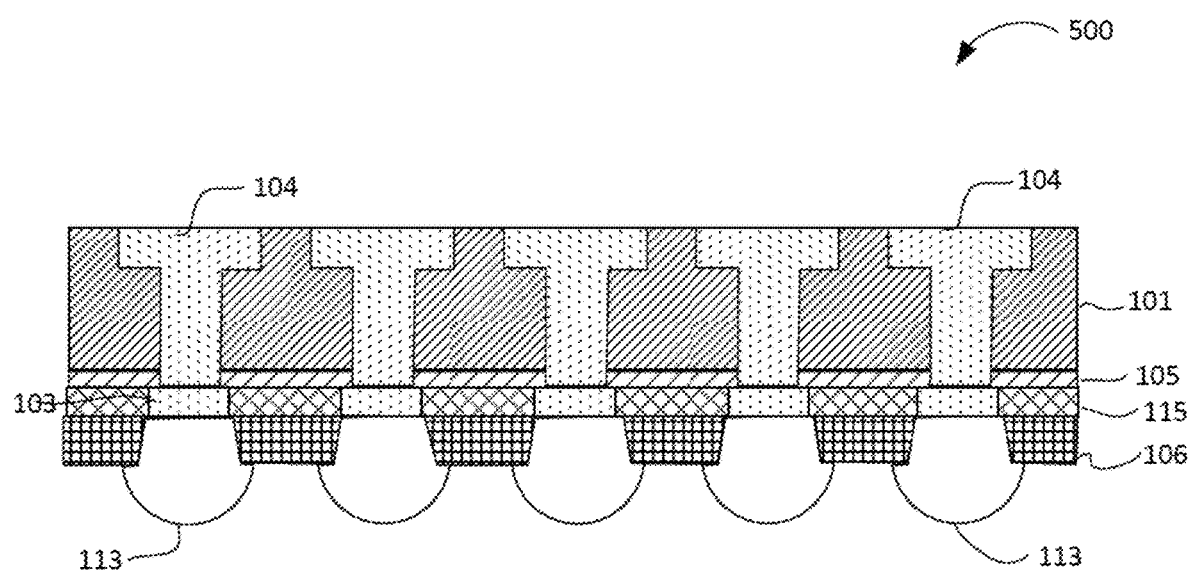
FIG. 5 illustrates a cross-sectional view of a bridge die, according to some embodiments.

FIG. 5 illustrates a cross-sectional view of a third embodiment of a bridge die 500, according to some embodiments.

In FIG. 5, a third dielectric layer 115 is added to bridge die 500 and sandwiched between first dielectric layer 105 and second dielectric layer 106. In some embodiments, third dielectric layer 115 is composed of silicon oxides. In some other embodiments, third dielectric layer 115 is composed of one of silicon nitrides (SiN), silicon oxynitride (SiON), carbon-doped oxide (SiOC(H)), Methyl silsesquioxane (MSQ), Hydrogen silsesquioxane (HSQ), porous dielectrics, etc. Other structures in and configurations in bridge die 500 are substantially the same as for bridge die 300, the description of which is provided in corresponding paragraphs above.

FIGS. 6A-6I illustrate a sequence of cross-sectional views of the evolution of the bridge die architecture 500 illustrated in FIG. 5, as selected operations of an exemplary fabrication method are performed, according to some embodiments.

Figure 6A:
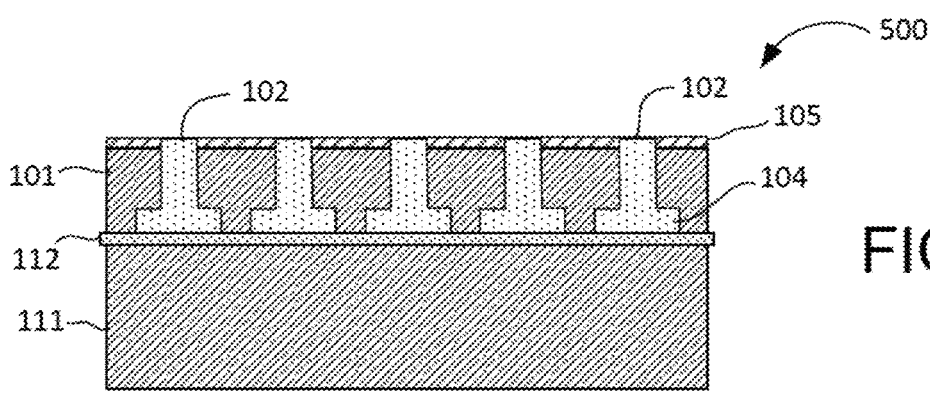
FIGS. 6A-6I illustrate a sequence of cross-sectional views of the evolution of the bridge die architecture illustrated in FIG. 5, as selected operations of an exemplary fabrication method are performed, according to some embodiments.

In FIG. 6A, partially complete bridge die 500 is shown at a mid-flow level. In some embodiments, bridge die 500 is at the same level of preparation as bridge die 100 shown in FIG. 2E, where vias 102 are planarized to the level of first dielectric layer 105.

Figure 6B:
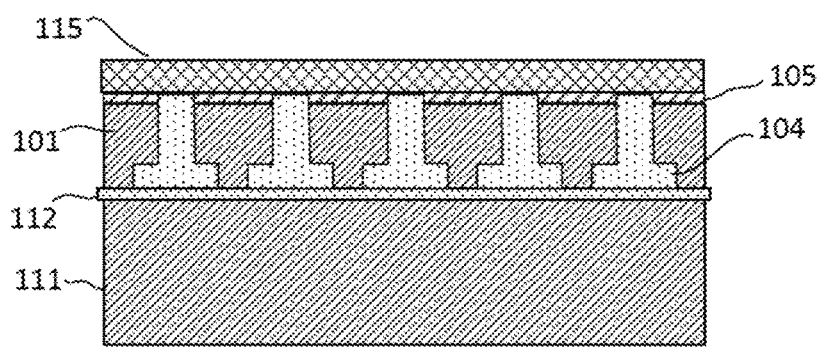

In FIG. 6B, third dielectric layer 115 is grown over first dielectric layer 105, covering tops of vias 102, according to some embodiments. Third dielectric layer 115 may be formed by PECVD, LPCVD, sputtering techniques, and liquid phase deposition by dipping, spin and spray coating, according to some embodiments. In some embodiments, the third dielectric layer 115 is significantly thicker than first dielectric layer 105.

Figure 6C:
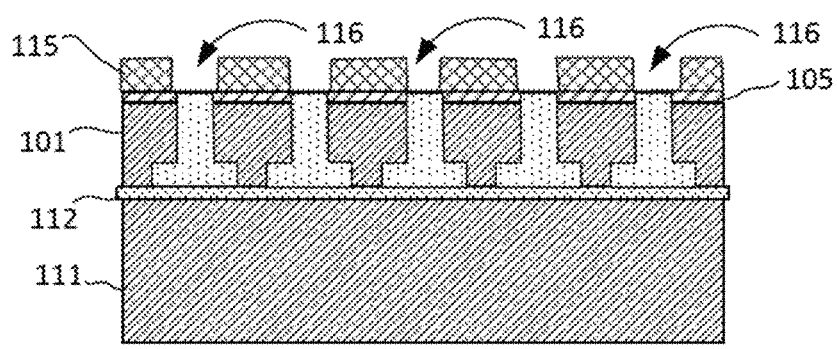

In FIG. 6C, openings 116 are made in third dielectric layer 115 over the tops of vias 102. In some embodiments, openings 116 are made by plasma etching (e.g., DRIE), exposing the tops of vias 102 and leaving them substantially free of dielectric.

Figure 6D:
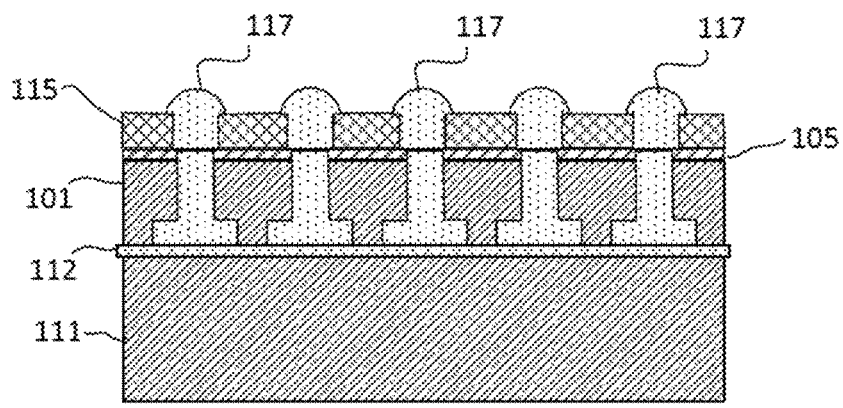

In FIG. 6D, metallization 117 is formed in openings 116. In some embodiments, metallization 117 is formed by electroplating a suitable metal (e.g., copper) into openings 116. In some embodiments, metallization 117 is formed by electroless deposition of a metal (e.g., copper) into openings 116.

Figure 6E:
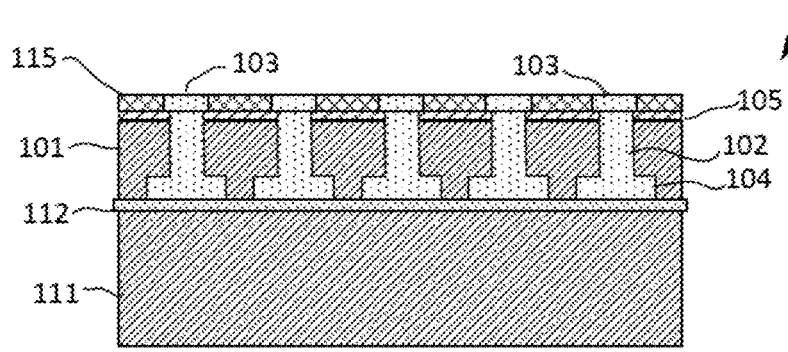
Figure 6F:
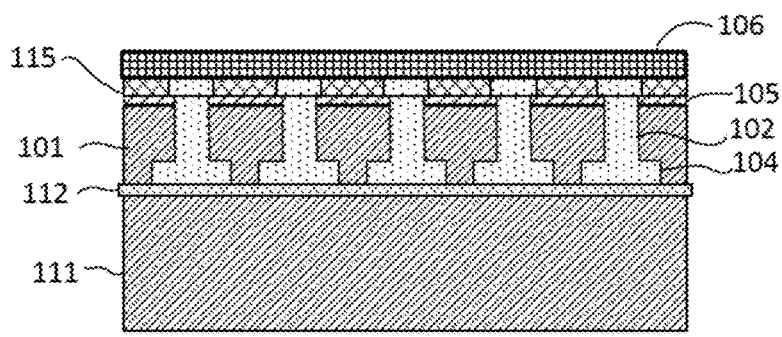

In FIG. 6E, metallization 116 and third dielectric layer are planarized, forming bond pads 103 from metallization 116. In FIG. 6F, second dielectric layer 106 is added, sandwiching third dielectric layer 115 between itself and first dielectric layer 105. In some embodiments, second dielectric layer is a die backside film laminate. In some embodiments, second dielectric layer is a dry resist laminate. In some other embodiments, second dielectric layer 106 is a cured layer applied in the liquid state (e.g., epoxy). In some embodiments, second dielectric layer 106 covers bond pads 103.

Figure 6G:
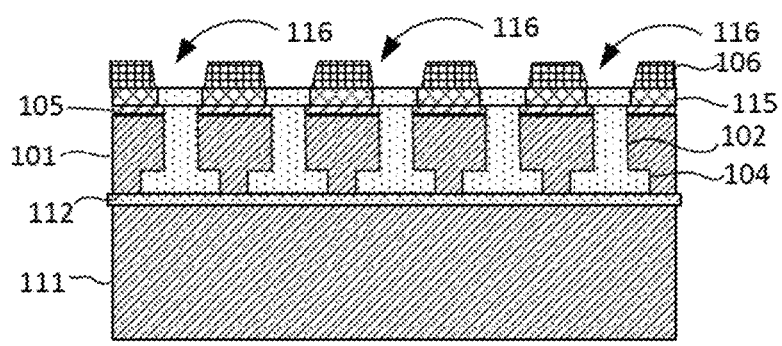

In FIG. 6G, openings 118 are made in second dielectric layer 106 exposing tops of bond pads 102, which are recessed below second dielectric layer 106, according to some embodiments. In some embodiments, openings 118 are formed by laser skiving. In some embodiments, openings 118 are formed by plasma etching (DRIE). In some embodiments, openings 118 are formed by photolithographic methods.

Figure 6H:
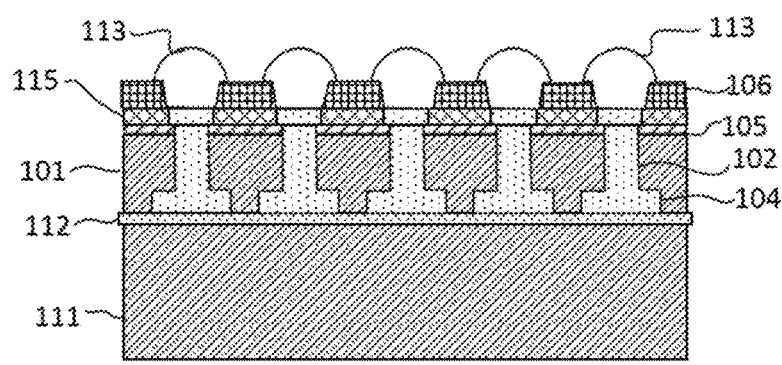

In FIG. 6H, solder bumps 113 are added by plating solder in openings 118. In some embodiments, epoxy flux films or epoxy flux pastes may be coated over solder bumps 113, as described for bridge die 300.

Figure 6I:
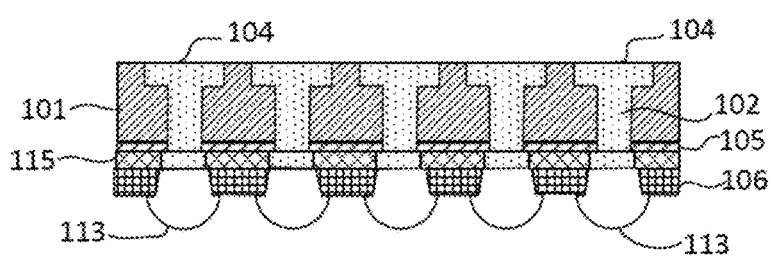

In FIG. 6I, carrier wafer 111 and adhesion layer 112 are removed from finished bridge die 500, shown inverted from previous views, with solder bumps 113 on the lower surface of bridge die 500 in preparation for bonding with a package substrate.

Figure 7:
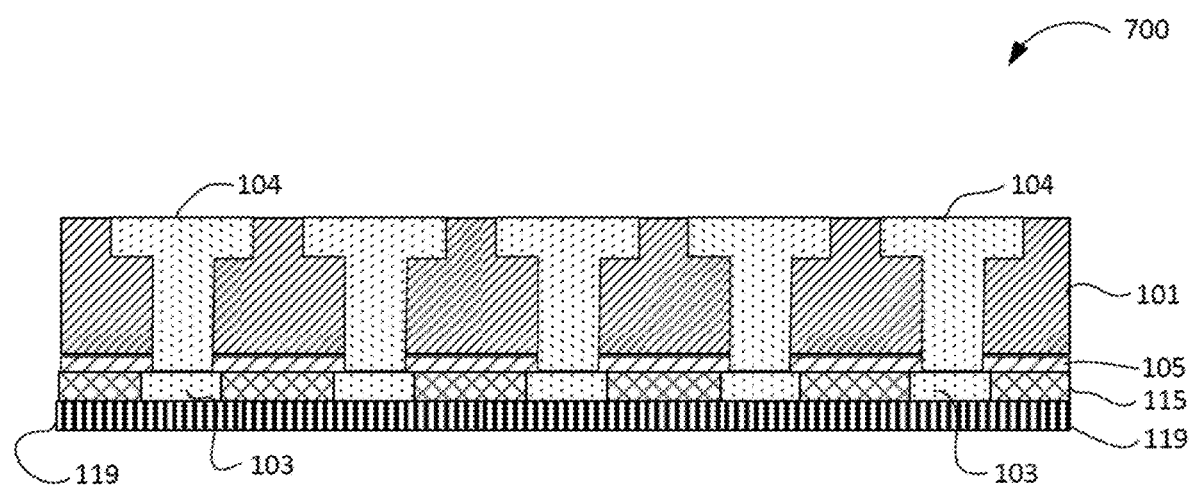
FIG. 7 illustrates a cross-sectional view of a bridge die, according to some embodiments.

FIG. 7 illustrates a cross-sectional view of a fourth embodiment 700 of a bridge die, according to some embodiments.

Bridge die 700 in FIG. 7 implements anisotropic conductive film (ACF) 119 for bonding mechanically and electrically to a package substrate layer. In some embodiments, ACF is laminated on third dielectric layer 115, and intimately covers bond pads 103, the tops of which are planar with third dielectric layer 115. In some embodiments, ACF 119 is spin coated or spray coated. ACF 119 contains conductive particles, such as carbon or gold micro—and nanoparticles, embedded in a polymeric matrix, such as a thermosetting epoxy resin. The conductivity is anisotropic in the thickness direction of the film, as conductive particles are trapped between conducting surfaces, and insulated from each other in the plane of the conducting surfaces. ACF 119 replaces solder bumps for electrical bonding.

Figure 8A:
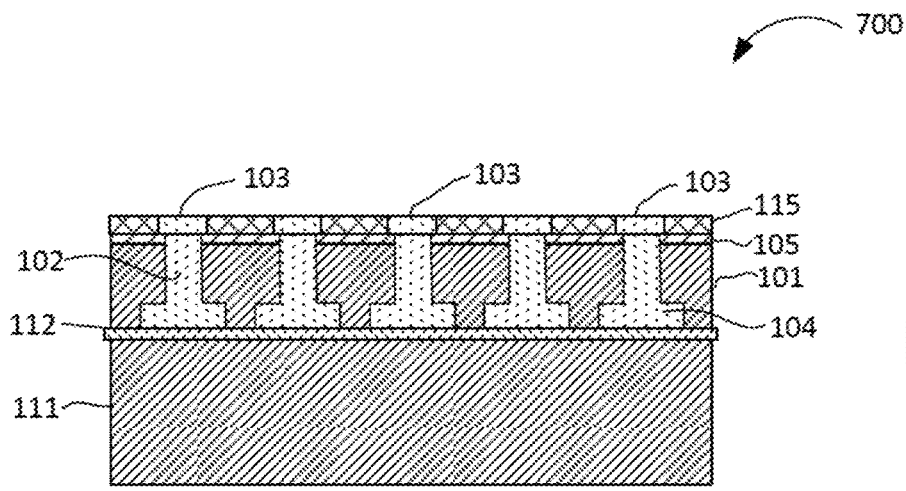
FIGS. 8A-8C illustrate a sequence of cross-sectional views of the evolution of the bridge die architecture illustrated in FIG. 7, as selected operations of an exemplary fabrication method are performed, according to some embodiments.
Figure 8B:
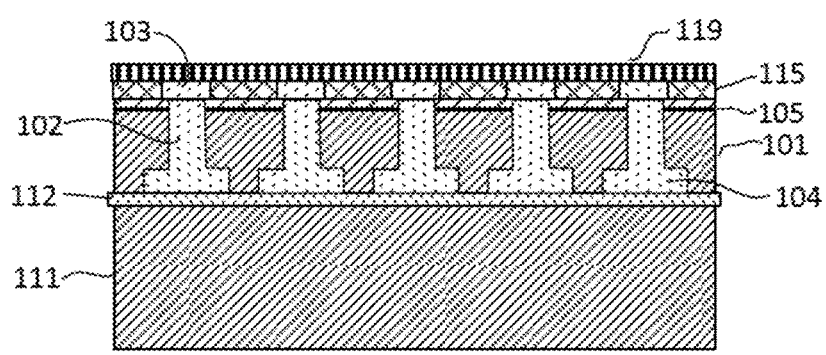
Figure 8C:
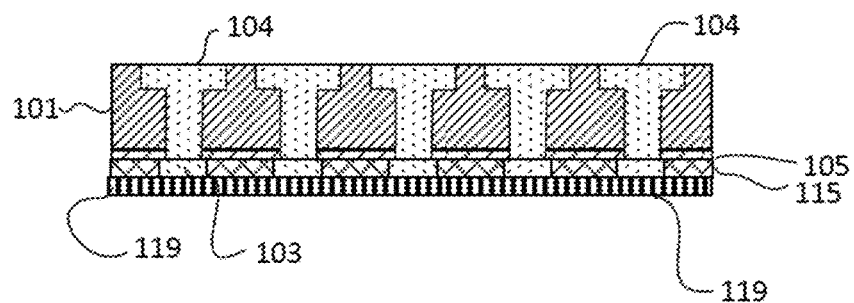

FIGS. 8A-8C illustrate a sequence of cross-sectional views of the evolution of the bridge die architecture 700 illustrated in FIG. 7, as selected operations of an exemplary fabrication method are performed according to some embodiments.

In FIG. 8A, partially complete bridge die 700 is shown at a mid-flow level. In some embodiments, bridge die 500 is at the same level of preparation as bridge die 500 shown in FIG. 6E, where third dielectric layer 115 and metallization 117 are planarized to form exposed bond pads 103 embedded in third dielectric layer 115.

In FIG. 8B, ACF 119 is applied over third dielectric 115, covering bond pads 103. In some embodiments, ACF 119 is initially liquid and is applied by spin coating or spray coating. In some embodiments, ACF 119 is partially polymerized, and is applied by lamination. In some embodiments, ACF 119 remains partially polymerized after application.

In FIG. 8C, carrier wafer 111 and adhesion layer 112 are removed from finished bridge die 700, shown inverted from previous views, with ACF 119 on the lower surface of bridge die 700 in preparation for bonding with a package substrate.

Figure 9A:
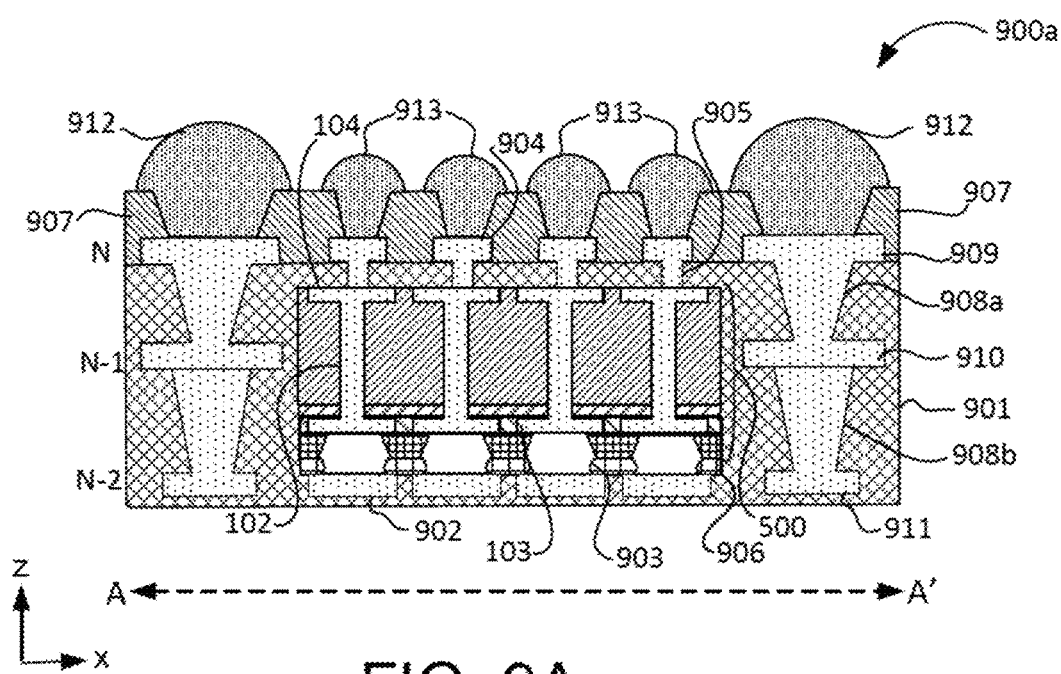
FIG. 9A illustrates a cross-sectional view of a first package substrate incorporating a bridge die, according to some embodiments of the disclosure.

FIG. 9A illustrates a cross-sectional view of package substrate 900a incorporating bridge die 500, according to some embodiments of the disclosure.

Package substrate 900a comprises bridge die 500 embedded within dielectric 901. In some embodiments, dielectric 901 of package substrate 900a comprises dielectric organic film laminate layers stacked vertically (in the z-direction of the figure) and interleaved with conductive layers. Conductive layers may be formed by electrodeposition or by other suitable deposition processes (as described below), a suitable conductive material comprising any one or combination of copper, nickel, gold, silver, aluminum or tungsten over the dielectric film laminates comprising dielectric 901. As shown in FIG. 9A, package substrate 900a comprises multiple metallization (e.g., conductive) layers that are labelled N, N-1, N-2, etc., which are vertically stacked metallization levels (in the z-direction of the figure) within package substrate 900a.

Metallization layers may be formed by electrodeposition of copper or other suitable metals as layers up to 30 microns thick over the dielectric films after deposition (e.g., lamination) of one or more layers of dielectric film. While three metallization (conductive) levels N through N-2 are shown, it will be understood that package substrate 900a may comprise additional buried metallization levels (e.g., N-3, N-4, etc.) that may comprise trace routing extending laterally within each level. As an example, level N-2 comprises subsurface metallization structures 902 that are coupled to bridge die 500, and subsurface conductive structures 909 that are described below. In some embodiments, level N-2 is the bottom-most level (e.g., land side) of package substrate 900a, and conductive structures 902 and 909 are land side bond pads.

As an example, package substrate 900a may comprise layers of organic build-up dielectric film. Organic film materials include, but are not restricted to, epoxy resin composites comprising phenolic hardeners or cyanate ester hardeners. In some embodiments, epoxy build-up films laminates have a thicknesses ranging from 10 to 100 microns. In some embodiments, build-up organic films comprise silicate filler material. In alternative embodiments, substrate build up film comprises resin-coated copper (RCC) film laminates. RCC films may comprise a thin film of copper (e.g., 0.1 to 2 micron-thick layer of copper) coated on an epoxy-based dielectric layer that is 10-100 microns thick.

In some embodiments, package substrate 900a comprises a core sheet (not shown) buried within. The core, which may have a thickness of 1000 microns, may be overlaid on one or both side by dielectric 901. Dielectric 901 may overlay a core by lamination of dielectric build-up film over one side or both sides of the core. The core sheet may comprise a woven glass cloth internal support structure impregnated with a resin such as a bismaleimide triazine (BT) resin, as known in the art. A sheet of B-staged BT resin (e.g., prepreg) may intervene between two woven glass/BT laminates. Metallization layers may be present within the core at interfaces between BT laminates.

Referring again to FIG. 9A, package substrate 900a may be a bumpless build-up layer (BBUL) package, wherein bridge die 500 is embedded between metallization layers (e.g., between conductive levels N-2 and N). Landside (lower) bond pads 103 of bridge die 500 are solder-bonded to bond pads 902, in the N-2 level conductive layer. Vias 102 extend vertically (e.g., in the z-direction) through bridge die 500, interconnecting landside bond pads 103 to die-side bond pads 104, allowing vertical signal routing through bridge die 500. In some embodiments, vias 102 are through-silicon vias (TSVs). Bond pads 104 are coupled to contact pads 904 level N (e.g., top level conductive layer) through microvias 905. In some embodiments, bond pads 904 are first-level interconnect (FLI) pads at the top of dielectric 901. In the illustrated embodiment, bridge die 500 is located within a cavity (e.g., see FIG. 10C) formed in dielectric 901. Bond pads 103 on the land side of bridge die 500 are bonded to level N-2 conductive structures 902 by solder joints 903. Conductive structures 902 may be pads at the bottom of the cavity.

In some embodiments, an inter-layer dielectric (ILD) 906 may surround solder joints 903. In some embodiments, ILD 906 comprises an epoxy flux, epoxy underfill material or a die-backside film (DBF). ILD 906 may stabilize solder joints 903 and adhere bridge die 500 to dielectric 901.

In some embodiments, bond pads 104 of bridge die 500 are bonded to bond pads 904 in the N-conduction level of package substrate 500. In some embodiments, FLI bond pads 904 are revealed by openings in solder resist layer 907 over the surface of dielectric 901. In some embodiments, bond pads 904, have a center-to-center spacing of 100 microns or less.

In the illustrated embodiment, vias 908 (vias 908a and 908b collectively) are adjacent to bridge die 500 and extend through dielectric 901. As shown, vias 908 have a larger cross section than TSV vias 102, and may carry large currents for power routing to dies attached to package substrate 900a. Alternatively, vias 908 may have a cross section similar to TSV vias 102 for conducting low-power, high-frequency data signals. In some embodiments, vias 908 have a conical profile as shown in FIG. 9A. The conical profile of vias 908 may be an artifact of the fabrication process, where via holes are drilled in dielectric 901 by a laser drill. Generally, the laser drill beam has a Gaussian or similar radial energy distribution, where the laser energy is maximum at the beam center, and decays toward the beam periphery. The conical profile results form more rapid material removal during hole formation at the beam center relative to the periphery, thus the hole depth is maximal at the center and decreases from the center outward. Alternatively, a via hole formed by mechanical drilling has substantially vertical sidewalls. In some embodiments, vias 908 have a cylindrical profile with substantially vertical sidewalls as formed in mechanically drilled holes. Vias 908 may have maximal diameters ranging from 50 microns to 1000 microns.

Vias 908 are vertically stacked between conductive levels (e.g., via 908a between levels N and N-1, and via 908b between levels N-1 and N-2 as shown). In the illustrated embodiment, vias 908a and 908b interconnect conductive structures 909, 910 and 911 in each level N, N-1 and N-2, respectively. Conductive structures 909-911 may be trace metallization or bond pads. As an example, conductive structures 910 and 911 may be subsurface traces that laterally route power to other portions of buried metallization within conductive levels N-1 and N-2. As a further example, conductive structure 909 may be a power bond pad that is to connect to an attached die by solder bump 912 that is be reflowed during a die attach operation (see below). In the illustrated embodiment, conductive structures 909 may be power-routing FLIs, and are shown as larger structures than pads 904. Bond pads 904 may be data signal-routing FLIs, and may be bumped with solder bumps 913 for flip-chip die attachment. In some embodiments, TSVs 102 route power from conductive level N-2 to top level N, and are coupled to power circuits on one or more attached dies through. FLI bond pads 904.

Figure 9B:
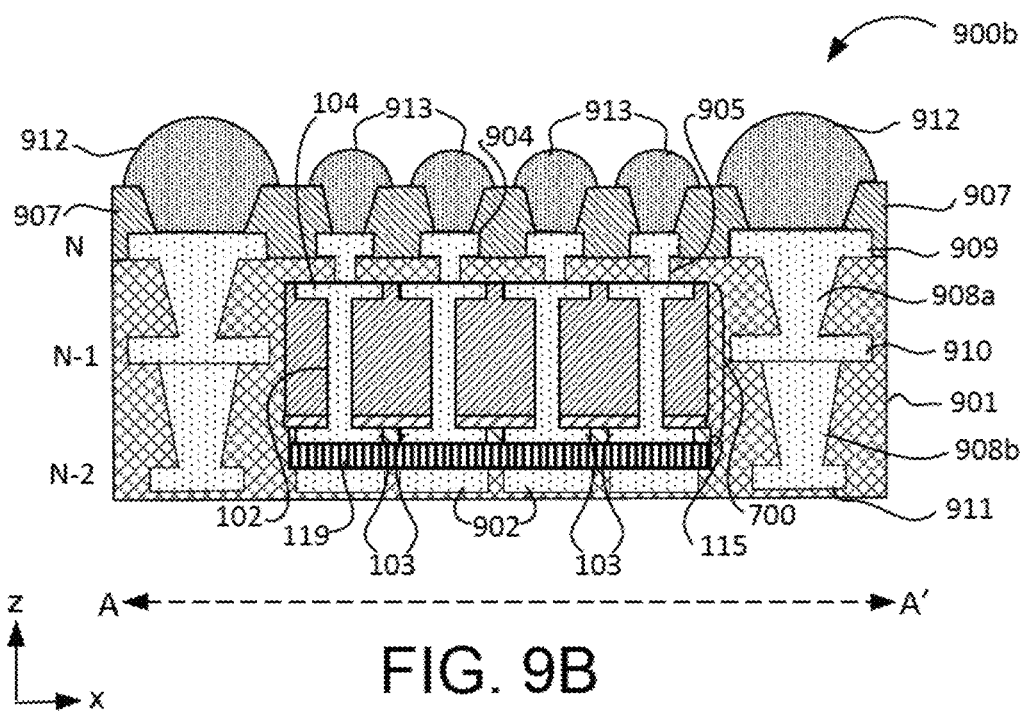
FIG. 9B illustrates a cross-sectional view of a second package substrate incorporating a bridge die, according to some embodiments of the disclosure.

FIG. 9B illustrates a cross-sectional view of package substrate 900b incorporating bridge die 700, according to some embodiments of the disclosure.

Package substrate 900b has a substantially similar architecture to package substrate 900a and will not be repeated here, with the exception of embedded bridge die 700. In some embodiments, package substrate 900b comprises a buried cavity (not shown; see FIG. 10C) in which bridge die 700 is embedded. Buried metallization may be exposed within the cavity. As described below, a cavity may be formed within dielectric 901 to a depth of conductive level N-2, where bond pads 902 are exposed at the bottom of the cavity. Bridge die 700 may be attached to bond pads 902 and to the surrounding dielectric 901 by anisotropic conductive film (ACF) 119.

In the illustrated embodiment, bridge die 700 is coupled to N-2 level metallization by ACF 119 between bond pads 103 and package bond pads 902. Solder joints (e.g., solder joints 903) may be replaced by ACF 119, which exhibits anisotropic conductivity substantially perpendicular to the plane of the film. ACF 119 couples bridge die electrically and mechanically to level N-2 metallization by adhesion to land side bond pads 103 and bond pads 902. In some embodiments, anisotropic conductive film 119 comprises an adhesive material that causes bridge die 700 to adhere to surrounding dielectric 901. Anisotropic conductive film 119 provides a means of mechanically stabilizing bridge die 700 within dielectric 901 and mechanically stable electrical coupling to bond pads 902.

ACF 119 may comprise vertically-oriented (e.g., oriented substantially in the z-direction that is perpendicular to the plane of ACF 119) crystalline silver, gold, graphite or graphene needles that conduct electricity substantially perpendicular to the plane of the film (e.g., in the z-direction of the figure), with high lateral resistivity. Lateral conduction through anisotropic conductive film 119 is substantially suppressed. As a result, adjacent bond pads 102 and 902 remain substantially electrically isolated from each other (e.g., not short-circuited together), while conductivity perpendicular to the film is relatively high.

Figure 9C:
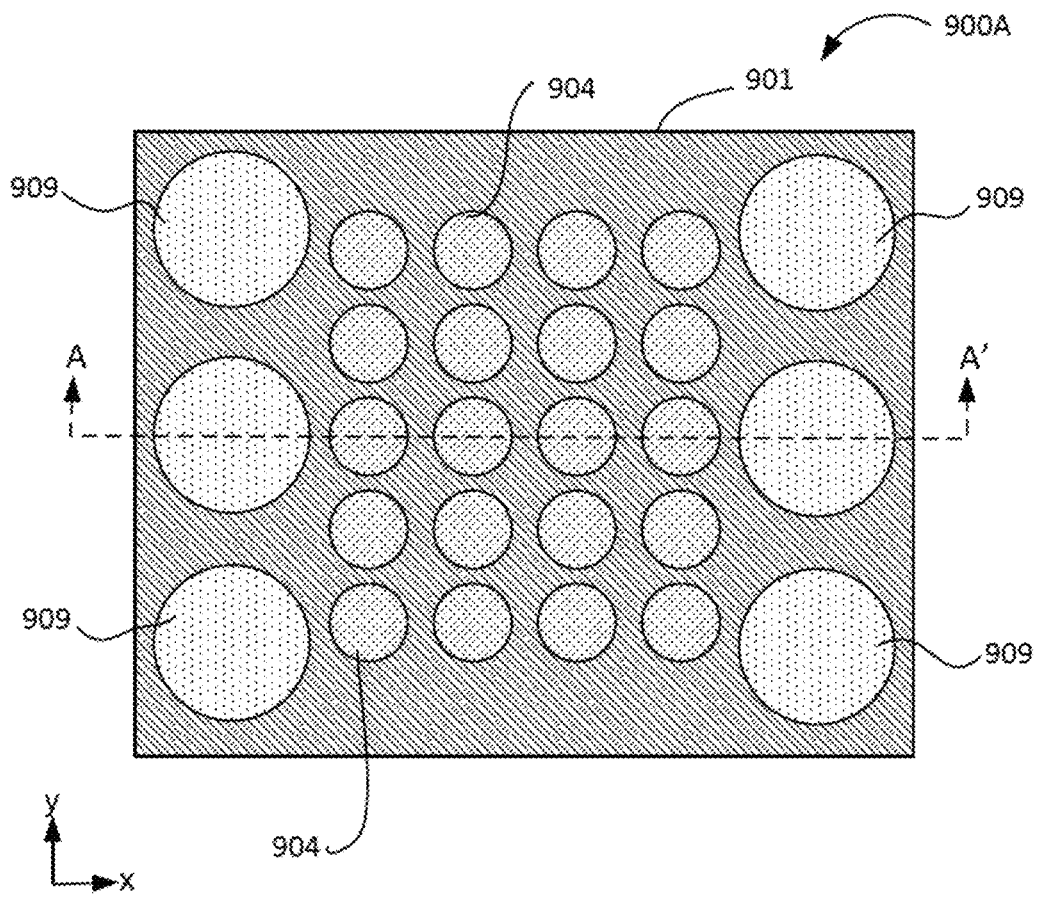
FIG. 9C illustrates a plan view of the package substrate depicted in FIG. 9A or FIG. 9B, according to some embodiments of the disclosure.

FIG. 9C illustrates a plan view of the package substrate 900a or 900b depicted in FIG. 9A or FIG. 9B, showing both low-density and high-density bond pads enabled by the embedded bridge die with vias, according to some embodiments of the disclosure.

An exemplary configuration of FLI bond pads 904 and 909 is shown. In some embodiments, low density (e.g., large pitch) contact arrays, such as the configuration of FLI power-routing bond pads 909, are interspersed with high-density (e.g., small pitch) signal-routing contact arrays, represented by FLI bond pads 904. Solder bumps 912 and 913 are not shown. As described above, the larger FLI bond pads 909 may handle higher currents than the high-density FLI contact array comprising bond pads 904.

In some embodiments, FLI bond pads 904 couple to high-density signal routing arrays on attached IC dies. In some embodiments, bridge die TSVs 102, which are smaller than vias 907 (not shown; see FIGS. 9A and 9B) may also couple to power circuits on one or more attached die(s). Power may be routed through lower package substrate bond pads (e.g., bond pads 902) is carried through bridge die TSVs (e.g., TSVs 102) to FLI bond pads 904 for delivery to power connections on IC dies.

Figure 10A:
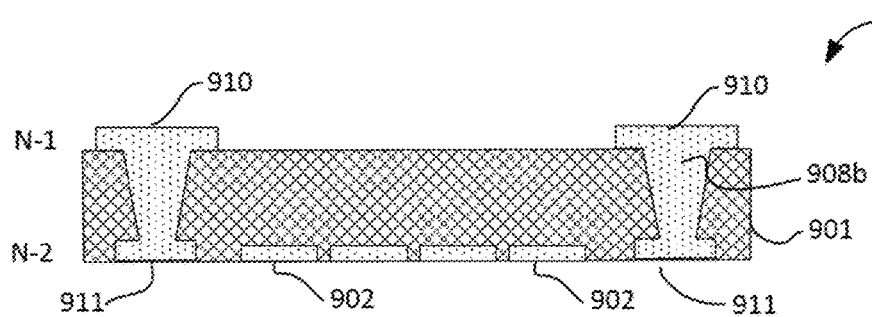
FIGS. 10A-I illustrate a sequence of cross-sectional views of the build-up of package substrate with an embedded bridge die, as selected operations of an exemplary fabrication method are performed according to some embodiments.

In the operation shown in FIG. 10A, a partially complete package substrate 900a is received, having been built up from the N-2 level metallization layer, in which bond pads 902 and 911 have been formed in a previous operation, according to some embodiments. Vias 908b have been formed in an earlier operation and extend though dielectric 901 of package substrate 900a, interconnecting lower package substrate bond pads 911 with mid-level package substrate bond pads 910. In some embodiments, mid-level package substrate bond pads 910 are formed in the N-1 level of package substrate 900a.

Package substrate 900a may be formed by a build-up process wherein the substrate is formed by stacking organic dielectric film laminates by successive lamination to vertically build-up dielectric 901. In some embodiments, package substrate 900a is formed by a bumpless build-up layer (BBUL) process, wherein the bridge die 500 is embedded within lower substrate layers during build-up fabrication of package substrate 900a. As part of the build-up process, metallization layers may be formed over each dielectric layer or over selected dielectric layers, where a metallization layer may be skipped between two or more adjacent dielectric laminates. In some embodiments, the organic dielectric laminates have thicknesses that range between 10 and 100 microns. Metallization layers, such as metallization level N-1, may be deposited over selected dielectric layers by galvanic electroplating or by electroless deposition. Level N-2 may be a mid-level buried metallization layer, or may be the bottom-most (e.g., land side) conductive level of package substrate 900a. The land-side metallization may be formed on a removable carrier, followed by lamination of a dielectric film over the formed conductive structures to begin the build-up process. The carrier may be later removed to liberate the bottom (land side) conductive structures, such as bond pads 902 and 911.

Metallization features (e.g., conductive structures such as bond pads 902 and 910) may be formed additively by through-mask electrogalvanic (e.g., electroplating) or electroless deposition, producing lithographically-defined metallization features such as bond pads 902, 910 and 911 directly over dielectric layers. Alternatively, metallization structures may be formed subtractively by through-mask etching of an electrodeposited metal layer. Suitable metals or electrically conductive materials include, but are not limited to, copper, nickel, silver, gold, aluminum cobalt or tungsten. In some embodiments, an electrically conductive seed layer is first deposited over dielectric material. The seed layer is necessary to provide a cathodic electrode surface that is conformal over the exposed dielectric, upon which a suitable metal may be electrodeposited. The seed layer is generally thin relative to the deposited conductive layer. Seed layers may have thickness of 100 nanometers (nm) or less, and are deposited over exposed dielectric material by a suitable technique such as sputtering (DC or RF), or vacuum evaporation (e.g., evaporation of a thin layer (10-100 nm) of gold). Seed layers may comprise copper, silver, gold, nickel or aluminum. Alternatively, a seed layer may be formed by electroless deposition of copper or other suitable metal directly on the exposed dielectric material. Generally, the exposed dielectric is chemically treated with a solution of catalyst, such as aqueous palladium chloride, to initiate electroless deposition on the dielectric surface. Generally, metallization layers may range in thickness up to 50 microns, depending on the intended magnitudes of current that ensuing structures are to carry. In some embodiments, chemical vapor deposition may be employed to deposit metallization layers ranging up to several tens of microns.

Vias 908b may be formed by first producing a via hole in dielectric 901 by laser drilling process or by a mechanical drilling process as described earlier, then electroplating a suitable metal such as copper into the hole. Hole formation may precede formation of the N-1 metallization level. Electrodeposition of, by way of example, copper, into the formed holes may fill the holes to the top, where metal overflows the hole and spreads over the dielectric surface. A conformal seed layer may be initially deposited into the formed holes and the adjacent dielectric surface to facilitate spreading of the top of the via to form an extensive conductive layer over the dielectric surface in the N-1 level, or to merge with a N-1 level conductive layer that may have been formed simultaneously with the via.

Figure 10B:
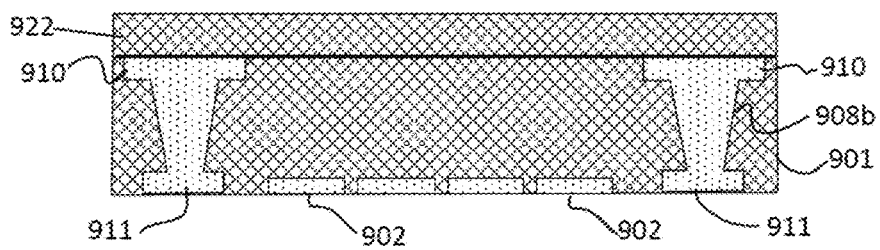

In the operation shown in FIG. 10B, dielectric film 922 is laminated over package dielectric 901 and mid-level package substrate bond pads 910 and burying the N-1 level conductive layer. In some embodiments, dielectric 901 comprises an organic resin such as, but not limited to, an epoxy resin. Package substrate 900a may comprise layers of organic build-up dielectric film. Organic film materials include, but are not restricted to, epoxy resin composites comprising phenolic hardeners or cyanate ester hardeners. In some embodiments, epoxy build-up films laminates have a thicknesses ranging from 10 to 100 microns. In some embodiments, build-up organic films comprise silicate filler material. In alternative embodiments, substrate build up film comprises resin-coated copper (RCC) film laminates. RCC films may comprise a thin film of copper (e.g., 0.1 to 2 micron-thick layer of copper) coated on an epoxy-based dielectric layer that is 10-100 microns thick.

Figure 10C:
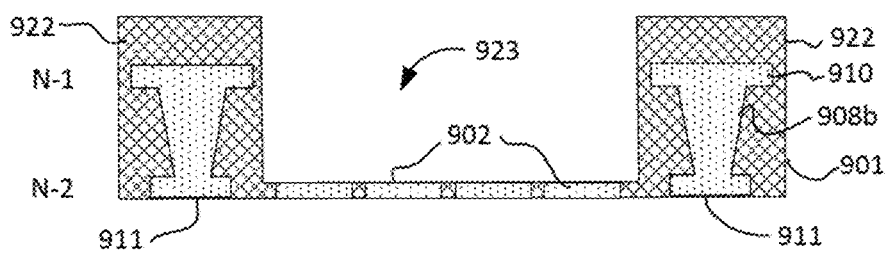

In the operation shown in FIG. 10C, cavity 923 is formed in dielectric 920 between vias 909. In some embodiments, the bottom of cavity 923 is the N-2 level conductive layer. In some embodiments, formation of cavity 923 reveals lower package substrate bond pads 904 at the bottom of cavity 923 to be accessed in subsequent operations. In some embodiments, cavity 923 is formed by laser skiving. In some embodiments, cavity 923 is formed by plasma etching (e.g., DRIE).

Figure 10D:
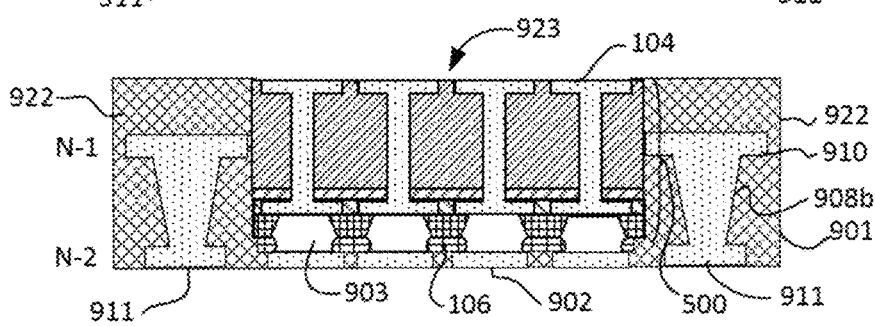

In the operation shown in FIG. 10D, bridge die 901 is inserted in cavity 923, and bonded to lower package substrate bond pads 904 revealed at the bottom of cavity 923. In some embodiments, bonding is achieved by formation of solder joints. In some embodiments, an epoxy flux film is disposed on bridge die 901 to aid solder bonding and provide protection of the solder joints. In some embodiments, an epoxy flux paste is disposed on bridge die 901 to aid solder bonding and provide protection of the solder joints. In some embodiments, bonding is achieved by adhesion of ACF.

Figure 10E:
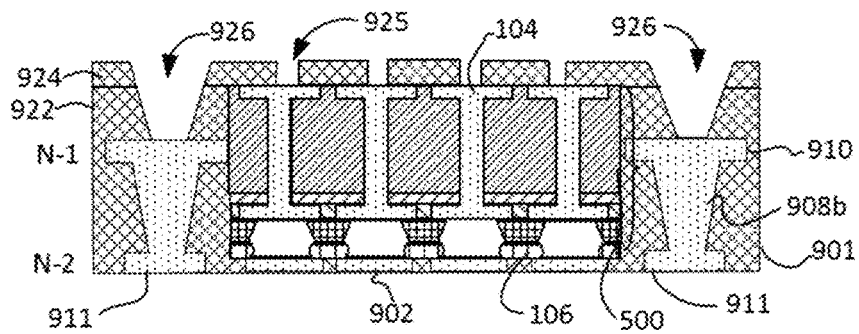

In the operation shown in FIG. 10E, dielectric layer 924 is laminated over dielectric layer 922, covering cavity 923 and bridge die 500. After lamination, dielectric layer 924 is patterned with openings 925 for electrodeposition of microvias (e.g., microvias 905) to interconnect bond pads 104 with substrate FLI bond pads (e.g., bond pads 904). Openings 925 may be formed by laser drilling over bond pads 104 of bridge die 500 to the top of bridge die 500, revealing a portion of bond pads 104. The metal of bond pads 104 may function as a laser stop, so that the laser beam does not penetrate into lower substrate layers. As shown in the figure, openings 925 may have a conical profile due to the laser energy profile described above. In some embodiments, openings 925 are formed by mechanical drilling, where sidewalls of openings 925 may be substantially vertical. Alternatively, openings 925 may be formed by a dry etch process such as dry reactive ion etching (DRIE), forming substantially vertical sidewalls as well. A desmear step may follow the drill step to remove organic debris around the metal structure.

Similarly, openings 926 adjacent to bridge die 500 may be formed by a larger diameter laser or mechanical drill. Openings 926 may be drilled into dielectric layer 924 and further into dielectric 901 to a depth of level N-1, revealing a portion of bond pads 910. Openings 926 are formed for electroplating through-package vias (e.g., vias 908b). In the illustrated embodiment, openings 926 have a conical profile as described for openings 925, but the shape of the openings is not limited to a conical profile. Substantially vertical sidewalls of openings 926 may be formed by mechanical drilling.

Figure 10F:
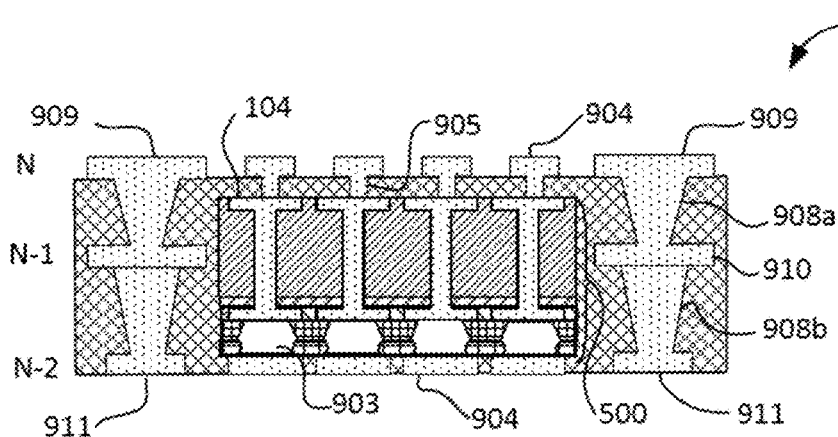

In the operation shown in FIG. 10F, microvias 905 and FLI bond pads 904, as well as vias 908a and bond pads 909 are formed. Microvias 905 are formed by electroplating copper or another suitable metal into openings 925, according to some embodiments. FLI bond pads 904 may be formed additively by continuing the electroplating process so that openings 925 are filled and tops of microvias 905 grow laterally over the surface of dielectric layer 924 to form bond pads 904 (e.g., lateral overgrowth of microvias 905). Growth of bond pads 904 may be controlled kinetically by adjustment of electrochemical conditions to attain uniform growth of all pads 904 to a target diameter and thickness. Alternatively, bond pads 904 may be formed additively by further electrodeposition (e.g., after formation of microvias 905) through a lithographically-defined deposition mask. In some embodiments, bond pads 904 may be formed in a subtractive etch process. A conductive layer (e.g., a copper layer) may be deposited over dielectric layer 924 before or after formation of openings 925 and/or 926 up to a thickness of 35-50 microns. An etch mask may be deposited over the conductive layer and features like bond pads 904 are lithographically defined by a metal etch (e.g., copper etch).

Vias 908a may be formed by electrodeposition of a suitable metal such as copper into openings 926. In a process similar to formation a bond pads 904, FLI bond pads 909 may be formed by lateral overgrowth of vias 908a. The alternative methods of making bond pads 904 may be employed for formation of bond pads 909. Bond pads 909 may be formed simultaneously with bond pads 904.

Figure 10G:
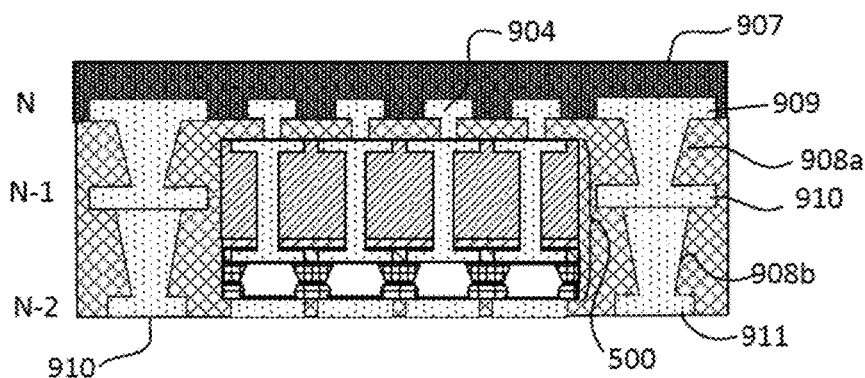
Figure 10H:
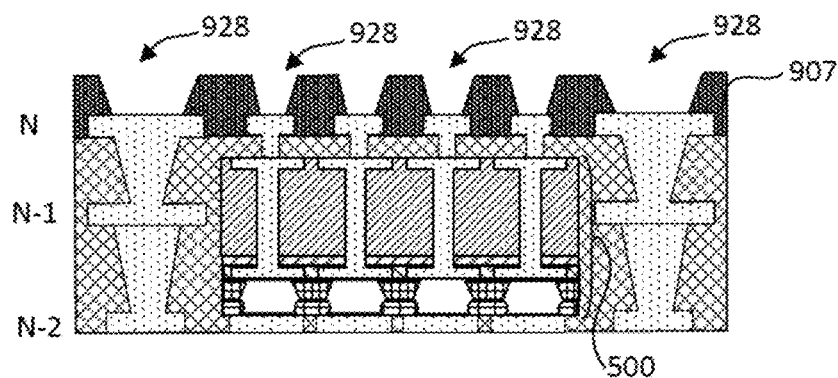
Figure 10I:
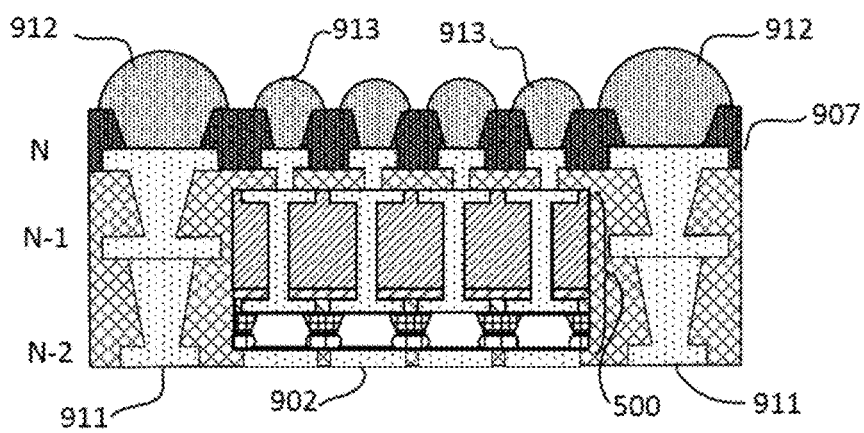

In FIG. 10G, solder mask resist layer 907 is formed over FLI bond pads 904 and 909, according to some embodiments. In FIG. 10H, openings 928 are formed in solder mask resist layer 907. In some embodiments, openings 928 are aligned with FLI bond pads 904 and 909. In FIG. 10I, solder bumps 912 and 913 are plated into openings 928 and bonded to FLI bond pads 904 and 909.

Figure 11:
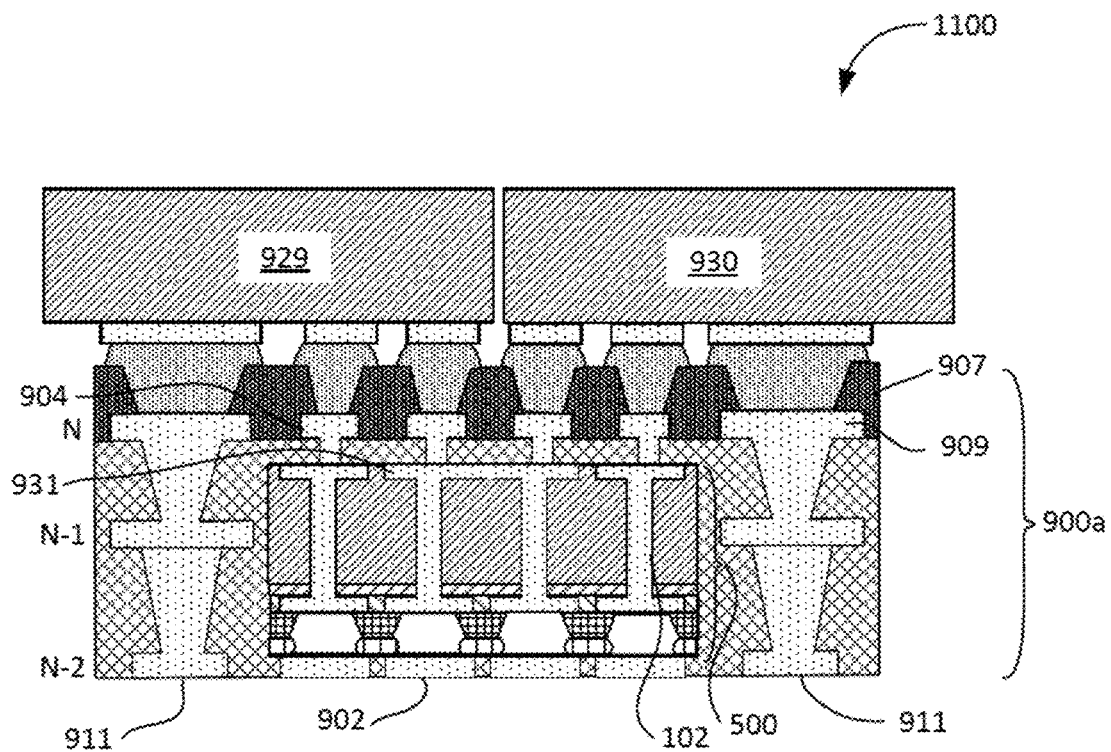
FIG. 11 illustrates a cross-sectional view of an IC package with an embedded bridge die having through-silicon-vias (TSVs) and two external dies bonded first-level interconnect (FLI) bond pads on the IC package, according to some embodiments of the disclosure.

FIG. 11 illustrates a cross-sectional view of system-on-chip (SoC) package 1100 comprising package substrate 900a with embedded bridge die 500 and two external dies 929 and 930 bonded to FLI bond pads, according to some embodiments of the disclosure.

FIG. 11 shows package substrate 900a of SoC package 1100 bonded to active dies 929 and 930 that are interconnected through bridge die 500. In some embodiments, Dies 929 and 930 are bonded to bridge die 500 through FLI bond pads 904, which accommodate the bond pad pitch of dies 929 and 930. Bridge die 500 may route power and data signals from land side bond pads 902 and 911 to dies 929 and 930 by TSVs 102 of bridge die 500. According to some embodiments, a short path for power routing to dies 929 and 930 from lower package levels (e.g., from level N-2) to the top package level (e.g., level N) is made possible by the package architecture exemplified by package 900. Wrap-around power routing, where power routing must be brought to dies 929 and 930 over the surface of the package level to which the dies are bonded, is avoided by providing embedded bridge die 500 having TSVs 102.

In some embodiments, bridge die 500 has horizontally connected bond pads, as shown in FIG. 11 with a horizontal interconnect trace 931 connecting two die bond pads 104. In some embodiments, high density signal routing between separate dies 929 and 930 is achieved by the horizontal interconnect architecture, exemplified by the implementation of interconnect trace 931.

Figure 12:
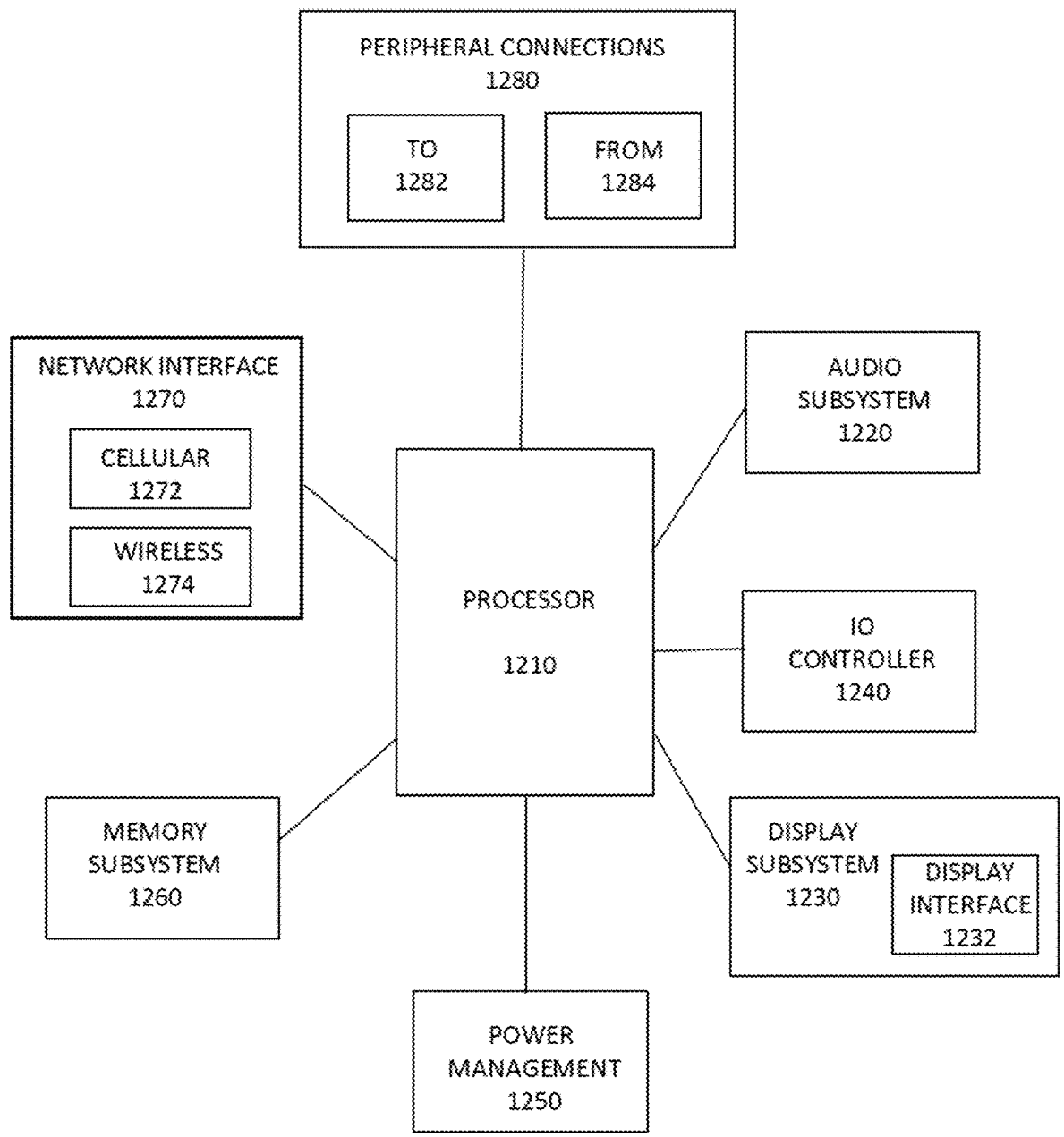
FIG. 12 illustrates a block diagram of a computing device comprising an IC package incorporating a substrate-embedded bridge die connecting multiple dies as part of a system-on-chip (SoC) package in an implementation of the computing device, according to some embodiments of the disclosure.

FIG. 12 illustrates a block diagram of computing device 1200 comprising an IC incorporating bridge die 500 or 700 connecting multiple dies as part of a system-on-chip (SoC)

package (e.g., SoC package 1100) in an implementation of computing device 1200, according to some embodiments of the disclosure.

FIG. 12 illustrates a block diagram of an embodiment of computing device 1200 in which flat surface interface connectors could be used. In some embodiments, computing device 1200 represents a mobile computing device, such as a computing tablet, a mobile phone or smart-phone, a wireless-enabled e-reader, or other wireless mobile device. It will be understood that certain components are shown generally, and not all components of such a device are shown in computing device 1200.

In some embodiments, computing device 1200 includes a first processor 1210. The various embodiments of the present disclosure may also comprise a network interface within 1270 such as a wireless interface so that a system embodiment may be incorporated into a wireless device, for example, cell phone or personal digital assistant.

In one embodiment, processor 1210 can include one or more physical devices, such as microprocessors, application processors, microcontrollers, programmable logic devices, or other processing means. The processing operations performed by processor 1210 include the execution of an operating platform or operating system on which applications and/or device functions are executed. The processing operations include operations related to I/O (input/output) with a human user or with other devices, operations related to power management, and/or operations related to connecting the computing device 1200 to another device. The processing operations may also include operations related to audio I/O and/or display I/O.

In one embodiment, computing device 1200 includes audio subsystem 1220, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1200, or connected to the computing device 1200. In one embodiment, a user interacts with the computing device 1200 by providing audio commands that are received and processed by processor 1210.

Display subsystem 1230 represents hardware (e.g., display devices) and software (e.g., drivers) components that provide a visual and/or tactile display for a user to interact with the computing device 1200. Display subsystem 1230 includes display interface 1232, which includes the particular screen or hardware device used to provide a display to a user. In one embodiment, display interface 1232 includes logic separate from processor 1210 to perform at least some processing related to the display. In one embodiment, display subsystem 1230 includes a touch screen (or touch pad) device that provides both output and input to a user.

I/O controller 1240 represents hardware devices and software components related to interaction with a user. I/O controller 1240 is operable to manage hardware that is part of audio subsystem 1220 and/or display subsystem 1230. Additionally, I/O controller 1240 illustrates a connection point for additional devices that connect to computing device 1200 through which a user might interact with the system. For example, devices that can be attached to the computing device 1200 might include microphone devices, speaker or stereo systems, video systems or other display devices, keyboard or keypad devices, or other I/O devices for use with specific applications such as card readers or other devices.

As mentioned above, I/O controller 1240 can interact with audio subsystem 1220 and/or display subsystem 1230. For example, input through a microphone or other audio device can provide input or commands for one or more applications or functions of the computing device 1200. Additionally, audio output can be provided instead of, or in addition to display output. In another example, if display subsystem 1230 includes a touch screen, the display device also acts as an input device, which can be at least partially managed by I/O controller 1240. There can also be additional buttons or switches on the computing device 1200 to provide I/O functions managed by I/O controller 1240.

In one embodiment, I/O controller 1240 manages devices such as accelerometers, cameras, light sensors or other environmental sensors, or other hardware that can be included in the computing device 1200. The input can be part of direct user interaction, as well as providing environmental input to the system to influence its operations (such as filtering for noise, adjusting displays for brightness detection, applying a flash for a camera, or other features).

In one embodiment, computing device 1200 includes power management 1250 that manages battery power usage, charging of the battery, and features related to power saving operation. Memory subsystem 1260 includes memory devices for storing information in computing device 1200. Memory can include nonvolatile (state does not change if power to the memory device is interrupted) and/or volatile (state is indeterminate if power to the memory device is interrupted) memory devices. Memory subsystem 1260 can store application data, user data, music, photos, documents, or other data, as well as system data (whether long-term or temporary) related to the execution of the applications and functions of the computing device 1200.

Elements of embodiments are also provided as a machine-readable medium (e.g., memory 1260) for storing the computer-executable instructions. The machine-readable medium (e.g., memory 1260) may include, but is not limited to, flash memory, optical disks, CD-ROMs, DVD ROMs, RAMS, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 1270 includes hardware devices (e.g., wireless and/or wired connectors and communication hardware) and software components (e.g., drivers, protocol stacks) to enable the computing device 1200 to communicate with external devices. The computing device 1200 could be separate devices, such as other computing devices, wireless access points or base stations, as well as peripherals such as headsets, printers, or other devices.

Network interface 1270 can include multiple different types of connectivity. To generalize, the computing device 1200 is illustrated with cellular connectivity 1272 and wireless connectivity 1274. Cellular connectivity 1272 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1274 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1280 include hardware interfaces and connectors, as well as software components (e.g., drivers, protocol stacks) to make peripheral connections. It will be understood that the computing device 1200 could both be a peripheral device ("to" 1282) to other computing devices, as well as have peripheral devices ("from" 1284) connected to it. The computing device 1200 commonly has a "docking" connector to connect to other computing devices for purposes such as managing (e.g., downloading and/or uploading, changing, synchronizing) content on computing device 1200. Additionally, a docking connector can allow computing device 1200 to connect to certain peripherals that allow the computing device 1200 to control content output, for example, to audiovisual or other systems.

In addition to a proprietary docking connector or other proprietary connection hardware, the computing device 1200 can make peripheral connections 1280 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus comprising: a package substrate comprises a first dielectric that has a first side opposing a second side, and comprises a first conductive layer on the first side of the first dielectric, and a second conductive layer between the first side and the second side of the first dielectric wherein the first conductive layer comprises a first plurality of conducive structures and the second conductive layer comprises a second plurality of conductive structures, and at least one at least one bridge die within the first dielectric, the at least one bridge die having a first side opposing a second side, and comprises a plurality of vias extending from the first side to the second side, wherein the at least one bridge die comprises a first plurality of pads on the first side and a second plurality of pads on the second side, and wherein ones of the first plurality of pads are interconnected to ones of the second plurality of pads by the plurality of vias, wherein the second plurality of pads on the second side of the at least one bridge die is coupled to the second conductive layer by solder joints between ones of the second plurality of pads and ones of the second plurality of conductive structures in the second conductive layer, or by an adhesive conductive film between the second plurality of pads and the second plurality of conductive structures in the second conductive layer, and wherein the adhesive conductive film is over a layer that comprises a second dielectric on the second side of the at least one bridge die.

Example 2 includes all the features of example 1, wherein the first and second conductive layers of the substrate comprise a plurality of pads and traces.

Example 3 includes all the features of example 2, wherein the at least one bridge die comprises a plurality of pads disposed on the first side of the at least one bridge die and a plurality of pads disposed on the second side of the at least one bridge die, wherein at least a portion of the plurality of pads on the first side of the at least one bridge die are interconnected by the plurality of vias to at least a portion of the plurality of pads on the second side of the at least one bridge die.

Example 4 includes all the features of example 3, wherein the at least one bridge die further comprises at least one trace on the first side and extends between two or more pads on the first side of the at least one bridge die, wherein the two or more pads are interconnected.

Example 5 includes all the features of example 3, wherein at least a portion of the of first plurality of conductive structures on the first side of the at least one bridge die is bonded to at least a portion of the first plurality of conductive structures.

Example 6 includes all the features of example 5, wherein solder joints are disposed between ones of the second plurality of pads on the second side of the at least one bridge die bonded to the second plurality of conductive structures of the second conductive layer of the substrate.

Example 7 includes all the features of example 1, wherein a third dielectric is between the second side of the at least one bridge die and the second conductive layer of the package substrate, and wherein the solder joints are within the third dielectric.

Example 8 includes all the features of example 7, wherein the third dielectric layer is a die backside film.

Example 9 includes all the features of examples 7 or 8, wherein the third dielectric is an epoxy flux film.

Example 10 includes all the features of examples 7 or 8, wherein the third dielectric is an epoxy flux paste.

Example 11 includes all the features of examples 7 or 8, wherein the third dielectric is a wafer level underfill film.

Example 12 includes all the features of examples 7 to 11, wherein the third dielectric surrounds the solder joints between the second plurality of pads and the second plurality of conductive structures in the second conductive layer of the package substrate.

Example 13 includes all the features of examples 7 to 12, wherein the third dielectric is bonded to a portion of the first dielectric.

Example 14 includes all the features of example 3, wherein the die comprises an adhesive conducive film over a layer of silicon oxide disposed on the second side of the at least one bridge die and forms a conductive bonding layer between the second plurality of pads disposed on the second side of the at least one bridge die and the second plurality of conductive structures in the second conductive layer of the package substrate.

Example 15 includes all the features of example 14, wherein the adhesive conductive film is bonded to the first dielectric.

Example 16 includes all the features of example 1, wherein the first conductive layer of the substrate is coupled to at least a portion of the first plurality of pads on the first side of the at least one bridge die.

Example 17 includes all the features if examples 2 to 16, wherein at least one die having a first side opposed to a second side and a plurality of pads on the second side coupled to at least a portion of the first plurality of pads on the first side of the at least one bridge die.

Example 18 includes all the features of example 1, wherein the plurality of vias extending between the first side and the second side of the at least one bridge die is coupled to signal routing traces in the second conductive layer of the package substrate.

Example 19 includes all the features of examples 2 to 18, wherein the plurality of vias extending between the first side and the second side of the at least one bridge die is coupled to power routing traces disposed in the second conductive layer of the substrate.

Example 20 includes all the features of examples 2 to 19, wherein the at least one bridge die comprises voltage regulation circuitry.

Example 21 includes all the features of example 20, wherein the voltage regulation circuitry comprises one or more fully integrated voltage regulator (FIVR) integrated circuits.

Example 22 includes all the features of example 1, wherein the package substrate is a coreless package substrate.

Example 23 includes all the features of example 1, wherein the at least one bridge die is at least partially composed of silicon.

Example 24 includes all the features of example 23, wherein the at least one bridge die is a silicon die.

Example 25 is a system, comprising: a package substrate comprising a first dielectric that has a first side opposing a second side, and comprises a first conductive layer on the first side of the first dielectric, and a second conductive layer between the first and second sides of the first dielectric, and wherein the first conductive layer comprises a first plurality of conductive structures and the second conductive layer comprises a second plurality of conductive structures; and at least one at least one bridge die within the first dielectric, the at least one bridge die having a first side opposing a second side, and comprises a plurality of vias extending from the first side to the second side wherein the at least one bridge die comprises a first plurality of pads on the first side and a second plurality of pads on the second side, wherein ones of the first plurality of pads are interconnected to ones of the second plurality of pads by the plurality of vias, wherein the second plurality of pads on the second side of the at least one bridge die is coupled to the second conductive layer by solder joints between ones of the second plurality of pads and ones of the second plurality of conductive structures in the second conductive layer, or by an adhesive conductive film between the second plurality of pads and the second plurality of conductive structures in the second conductive layer, and wherein the adhesive conductive film is over a layer that comprises a second dielectric on the second side of the at least one bridge die, a first active die on the first side of the first dielectric and coupled to the first conducive layer, a second active die on the first side of the first dielectric and coupled to the first conducive layer, wherein the first active die and the second active die are coupled to the at least one bridge die, wherein the at least one bridge die is to route power to the first and second active dies, and wherein the at least one bridge die is to route high-speed signals between the first active die and the second active die.

Example 26 includes all the features of example 25, wherein at least a portion of the plurality of pads in the second patterned conductive layer between the first and second sides of the package substrate is bonded to at least a portion of the plurality of pads on the second side of the at least one bridge die.

Example 27 includes all the features of example 25, wherein at least a portion of the plurality of pads on the second side of the first active die and at least a portion of the plurality of pads on the second side of the second active die are bonded to at least a portion of the plurality of pads on the first side of the at least one bridge die.

Example 28 includes all the features of examples 25 to 27, wherein the at least one bridge die interconnects the first active die to the second active die.

Example 29 includes all the features of examples 25 to 27, wherein the plurality of vias extending between the first side and the second side of the at least one bridge die is coupled to signal routing traces in the second conductive layer of the package substrate.

Example 30 includes all the features of examples 25 to 27, wherein the plurality of vias extending between the first side and the second side of the at least one bridge die is coupled to power routing traces in the second conductive layer of the package substrate.

Example 31 includes all the features of examples 25 to 27, wherein the at least a portion of the plurality of vias extending between the first side and the second side of the at least one bridge die is coupled to power routing traces in the second conductive layer of the package substrate and coupled to at least a portion the of plurality of pads on the second sides of the first active die and the second active die, wherein the at least a portion of the plurality of vias couple power from the package substrate to the first and second active dies.

Example 32 is a method, comprising: forming a package substrate having a first side and a second side, a first conductive layer on the first side and a second conductive layer between the first side and the second side of the substrate, a dielectric between the first conductive layer and the second conductive layer; forming a cavity between the first conductive layer and the second conductive layer between the first side and the second side of the package substrate, the second conductive layer forming the bottom of the cavity; inserting at least one bridge die into the cavity, the at least one bridge die having a first side and a second side, and a plurality of vias interconnecting at least a portion of a plurality of pads on the first side to at least a portion of a plurality of pads on the second side; and coupling at least a portion of the plurality of pads on the second side of the at least one bridge die to the second conductive layer of the package substrate.

Example 33 includes all the features of example 32, further comprising: forming a plurality of pads in the first conductive layer of the package substrate; and coupling at least a portion of the pads formed in the first conductive layer of the package substrate to at least a portion of the plurality of pads disposed on the first side of the at least one bridge die.

Example 34 includes all the features of example 33, further comprising: depositing solder bumps onto at least a portion of the plurality of pads formed in the first conductive layer of the package substrate; and bonding at least one active die to the at least a portion of the plurality of pads formed in the first conductive layer of the package substrate.

Example 35 includes all the features of example 32, wherein coupling at least a portion of the plurality of pads disposed on the second side of the at least one bridge die to the second conductive layer of the package substrate comprises forming solder joints between the at least a portion of the plurality of pads on second side of the at least one bridge die and the second conducive layer of the package substrate.

Example 36 includes all the features of example 35, wherein coupling at least a portion of the plurality of pads on the second side of the at least one bridge die to the second conductive layer of the package substrate comprises forming a dielectric layer surrounding the solder joints and adhering to the dielectric portion of the package substrate.

Example 37 includes all the features of example 36, wherein forming a dielectric layer surrounding the solder joints and adhering to the dielectric portion of the package substrate comprises reflowing a die backside film on the second side of the at least one bridge die.

Example 38 includes all the features of example 32, wherein coupling at least a portion of the plurality of pads on the second side of the at least one bridge die to the second conductive layer of the package substrate comprises forming an adhesive conductive film bond between the at least a portion of the plurality of pads on second side of the at least one bridge die and the second conducive layer of the package substrate.

Example 39 is a method, comprising: growing a plurality of vias in a package substrate comprising a first dielectric and having a first side and a second side, the vias extending partially into the substrate from a plurality of pads disposed on the first side of the substrate; recessing the second side of the substrate to reveal the plurality of vias; growing a second dielectric over the second side of the substrate; planarizing the revealed plurality of vias with the second dielectric; forming a plurality of pads on the second side of the substrate, the pads on the second side of the substrate interconnected by the plurality of vias with the plurality of pads disposed on the first side of the substrate; depositing a third dielectric on the second side of the substrate, the third dielectric covering the plurality of pads disposed on the second side of the substrate.

Example 40 includes all the features of example 39, wherein depositing a third dielectric on the second side of the substrate comprises depositing a die backside film on the second side of the substrate.

Example 41 includes all the features of any of examples 39 to 40, wherein depositing a third dielectric on the second side of the substrate comprises depositing an epoxy flux film.

Example 42 includes all the features of any of examples 39 to 40, wherein depositing a third dielectric on the second side of the substrate comprises depositing an epoxy flux paste.

Example 43 includes all the features of any of examples 39 to 40, wherein depositing a third dielectric on the second side of the substrate comprises depositing a wafer level underfill film.

Example 44 is a method, comprising: growing a plurality of vias in a substrate having a first side and a second side, the vias extending partially into the substrate from a plurality of pads disposed on the first side of the substrate; recessing the second side of the substrate to reveal the plurality of vias; growing a first dielectric over the second side of the substrate; planarizing the revealed plurality of vias with the first dielectric; growing a second dielectric over the first dielectric; forming a plurality of openings in the second dielectric, wherein the openings are aligned with the revealed plurality of vias planar with the first dielectric disposed on the second side of the substrate; forming a plurality of pads in the plurality of openings in the second dielectric, wherein the plurality of pads is coupled to the revealed plurality of vias; planarizing the pads with the second dielectric; depositing a third dielectric over the second dielectric layer covering the plurality of pads disposed on the second side of the substrate; and forming a plurality of openings in the third dielectric, wherein the openings are aligned with the plurality of pads on the second side of the substrate.

Example 45 includes all the features of example 44, wherein growing a second dielectric over the first dielectric comprises growing any of a silicon oxide, a silicon nitride or a silicon oxynitride layer over the first dielectric.

Example 46 includes all the features of example 44, wherein depositing a third dielectric over the second dielectric covering the plurality of pads on the second side of the substrate comprises depositing a die backside film on over the second dielectric.

Example 47 includes all the features of example 46, wherein depositing a die backside film on over the second dielectric comprises depositing any one of an epoxy flux film, an epoxy flux paste or a wafer level underfill film.

Example 48 is a method, comprising: growing a plurality of vias in a substrate having a first side and a second side, the vias extending partially into the substrate from a plurality of pads disposed on the first side of the substrate recessing the second side of the substrate to reveal the plurality of vias; growing a first dielectric over the second side of the substrate; planarizing the revealed plurality of vias with the first dielectric; growing a second dielectric over the planarized first dielectric; forming a plurality of openings in the second dielectric, wherein the openings are aligned with the revealed plurality of vias planar with the first dielectric disposed on the second side of the substrate; forming a plurality of pads in the plurality of openings in the second dielectric, wherein the plurality of pads is coupled to the revealed plurality of vias; planarizing the plurality of pads with the second dielectric; and depositing an adhesive conductive film over the second dielectric, wherein the adhesive conductive film contacts the plurality of pads on the second side of the substrate.

Example 49 is an apparatus, comprising: a substrate means for supporting one or more integrated circuits disposed on or in the substrate, and at least one bridge means for interconnecting the one or more integrated circuits disposed on or in the substrate, the at least one bridge means disposed within the substrate means.

Example 50 includes all the features of example 49, wherein the substrate means comprises a first conductive layer and a second conductive layer.

Example 51 includes all the features of example 50, wherein the at least one bridge means comprises vias interconnecting at least a portion of a plurality of pads disposed on a first side of the at least one bridge means with at least a portion of a plurality of pads disposed on a second side of the at least one bridge means.

Example 52 includes all the features of example 51, wherein at least a portion of the plurality of pads disposed on the second side of the at least one bridge means is coupled to the second conductive layer of the substrate means.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus, comprising:
   a package substrate comprising a plurality of subsurface metallization structures in a dielectric layer, the dielectric layer intervening between neighboring ones of the plurality of subsurface metallization structures;
   a bridge die in a cavity of the package substrate, the bridge die over the plurality of subsurface metallization structures, and the bridge die having vias between a bottom side and a top side of the bridge die, one of the vias electrically coupled to one of the plurality of subsurface metallization structures;
   a first via in the package substrate, the first via outside of the bridge die and laterally spaced apart from a first sidewall of the bridge die, wherein the first via has an uppermost surface above the top side of the bridge die; and
   a second via in the package substrate, the second via outside of the bridge die and laterally spaced apart from a second sidewall of the bridge die, wherein the second via has an uppermost surface above the top side of the bridge die, the second sidewall of the bridge die laterally opposite the first sidewall of the bridge die.

2. The apparatus of claim 1, wherein the vias of the bridge die extend from the bottom side to the top side of the bridge die.

3. The apparatus of claim 1, wherein the one of the vias is electrically coupled to the one of the plurality of subsurface metallization structures by a solder joint.

4. The apparatus of claim 1, further comprising:
   a first die over the package substrate, the first die electrically coupled to the bridge die and to the first via.

5. The apparatus of claim 4, further comprising:
   a second die over the package substrate and laterally spaced apart from the first die, the second die electrically coupled to the bridge die and to the second via.

6. The apparatus of claim 5, wherein the first die is electrically coupled to the second die by the bridge die.

7. The apparatus of claim 1, wherein the first via has a bottommost surface above the bottom side of the bridge die.

8. The apparatus of claim 1, wherein the bridge die is in the dielectric layer.

9. The apparatus of claim 8, wherein the first via and the second via are in the dielectric layer.

10. An apparatus, comprising:
    a substrate comprising a plurality of metallization structures in a dielectric layer, the dielectric layer intervening between neighboring ones of the plurality of metallization structures;
    a bridge die embedded within the substrate, the bridge die vertically over the plurality of metallization structures, and the bridge die having vias extending therein, one of the vias vertically over and coupled to one of the plurality of metallization structures;
    a first via in the substrate, the first via outside of the bridge die and laterally spaced apart from the bridge die along a first direction, wherein the first via has an uppermost surface above a top side of the bridge die; and
    a second via in the substrate, the second via outside of the bridge die and laterally spaced apart from the bridge die along a second direction, wherein the second via has an uppermost surface above the top side of the bridge die, the second direction opposite the first direction.

11. The apparatus of claim 10, wherein the vias of the bridge die extend entirely through the bridge die.

12. The apparatus of claim 10, wherein the one of the vias is coupled to the one of the plurality of metallization structures by a solder joint.

13. The apparatus of claim 10, further comprising:
    a first die coupled to the bridge die and to the first via, and a second die coupled to the bridge die and to the second via.

14. An apparatus, comprising:
    a substrate comprising a plurality of subsurface metallization structures in a dielectric layer, the dielectric layer intervening between neighboring ones of the plurality of subsurface metallization structures;
    a bridge die in the substrate in a region above the plurality of subsurface metallization structures, the bridge die having a top side opposite a bottom side, and a first sidewall and a second sidewall between the top side and the bottom side, the second sidewall laterally opposite from the first sidewall, and the bridge die having vias between the bottom side and the top side of the bridge die, one of the vias electrically coupled to one of the plurality of subsurface metallization structures;
    a first via in the substrate, the first via outside of the bridge die and laterally spaced apart from the first sidewall of the bridge die along a first direction, wherein the first via has an uppermost surface above the top side of the bridge die; and
    a second via in the substrate, the second via outside of the bridge die and laterally spaced apart from the second sidewall of the bridge die along a second direction, wherein the second via has an uppermost surface above the top side of the bridge die, the second direction opposite the first direction.

15. The apparatus of claim 14, wherein the vias of the bridge die extend from the bottom side to the top side of the bridge die.

16. The apparatus of claim 14, wherein the one of the vias is electrically coupled to the one of the plurality of subsurface metallization structures by a solder joint.

17. The apparatus of claim 14, further comprising:
a first die over the substrate, the first die coupled to the bridge die and to the first via.

18. The apparatus of claim 17, further comprising:
a second die over the substrate and laterally spaced apart from the first die, the second die coupled to the bridge die and to the second via.

\* \* \* \* \*